United States Patent
Chanemougame et al.

(10) Patent No.: US 11,665,878 B2
(45) Date of Patent: May 30, 2023

(54) CFET SRAM BIT CELL WITH TWO STACKED DEVICE DECKS

(71) Applicant: Tokyo Electron Limited, Tokyo (JP)

(72) Inventors: Daniel Chanemougame, Niskayuna, NY (US); Lars Liebmann, Mechanicville, NY (US); Jeffrey Smith, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 8 days.

(21) Appl. No.: 17/316,085

(22) Filed: May 10, 2021

(65) Prior Publication Data

US 2022/0102362 A1  Mar. 31, 2022

Related U.S. Application Data

(60) Provisional application No. 63/085,568, filed on Sep. 30, 2020.

(51) Int. Cl.
  *G11C 11/412*  (2006.01)
  *G11C 7/12*  (2006.01)
  (Continued)

(52) U.S. Cl.
  CPC .......... *H01L 27/1108* (2013.01); *G11C 5/063* (2013.01); *G11C 5/14* (2013.01);
  (Continued)

(58) Field of Classification Search
  CPC ......... H01L 27/1108; H01L 2924/1437; H01L 29/66439; G11C 5/063; G11C 5/14; G11C 7/12; G11C 11/412; G11C 2211/4013
  See application file for complete search history.

(56) References Cited

U.S. PATENT DOCUMENTS

| 9,997,598 B2 | 6/2018 | Smith et al. |
| 10,332,588 B2 | 6/2019 | Huynh Bao et al. |

(Continued)

FOREIGN PATENT DOCUMENTS

JP  2021535617 A  * 12/2021

OTHER PUBLICATIONS

International Search Report and Written Opinion of the International Search Authority dated Nov. 8, 2021 in PCT/US2021/041438, 10 pages.

*Primary Examiner* — Sultana Begum
(74) *Attorney, Agent, or Firm* — Oblon, McClelland, Maier & Neustadt, L.L.P.

(57) ABSTRACT

A static random access memory (SRAM) structure is provided. The structure includes a plurality of SRAM bit cells on a substrate. Each SRAM bit cell includes at least six transistors including at least two NMOS transistors and at least two PMOS transistors. Each of the at least six transistors being lateral transistors with channels formed from nano-sheets grown by epitaxy. The at least six transistors positioned in two decks in which a second deck is positioned vertically above a first deck relative to a working surface of the substrate, wherein at least one NMOS transistor and at least one PMOS transistor share a common vertical gate. A first inverter formed using a first transistor positioned in the first deck and a second transistor positioned in the second deck. A second inverter formed using a third transistor positioned in the first deck and a fourth transistor positioned in the second deck. A pass gate is located in either the first deck or the second deck.

20 Claims, 25 Drawing Sheets

(51) Int. Cl.
  *H01L 27/11* (2006.01)
  *G11C 5/06* (2006.01)
  *G11C 5/14* (2006.01)
(52) U.S. Cl.
  CPC .............. *G11C 7/12* (2013.01); *G11C 11/412* (2013.01); *G11C 2211/4013* (2013.01); *H01L 2924/1437* (2013.01)

(56) References Cited

U.S. PATENT DOCUMENTS

| | | |
|---|---|---|
| 10,453,850 B2 | 10/2019 | Smith et al. |
| 10,529,830 B2 | 1/2020 | Smith et al. |
| 10,573,655 B2 | 2/2020 | Smith et al. |
| 10,741,564 B2 | 8/2020 | Lee et al. |
| 10,916,550 B2 | 2/2021 | Liaw |
| 10,930,764 B2 | 2/2021 | Tapily et al. |
| 10,964,706 B2 | 3/2021 | Smith et al. |
| 11,114,447 B2 | 9/2021 | Lee et al. |
| 2017/0194330 A1 | 7/2017 | Lee et al. |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0174642 A1 | 6/2018 | Huynh Bao et al. |
| 2018/0240802 A1 | 8/2018 | Smith et al. |
| 2019/0326301 A1 | 10/2019 | Smith et al. |
| 2020/0035686 A1* | 1/2020 | Paul .................. H01L 29/78654 |
| 2020/0098897 A1 | 3/2020 | Tapily et al. |
| 2020/0135740 A1 | 4/2020 | Liaw |
| 2020/0185393 A1 | 6/2020 | Lee et al. |
| 2021/0159232 A1 | 5/2021 | Liaw |

* cited by examiner

CFET SRAM BIT CELL WITH TWO STACKED DEVICE DECKS

INCORPORATION BY REFERENCE

This present disclosure claims the benefit of U.S. Provisional Application No. 63/085,568, filed on Sep. 30, 2020, the entire content of which is incorporated herein by reference.

FIELD OF THE INVENTION

This disclosure relates to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

As the semiconductor industry transitions to new device architecture, from finFET to lateral gate-all-around nanosheet (LGAA NS), there is a significant research focus on the complementary FET device architecture, or CFET. CFET comprises stacking an NMOS device on top of a PMOS device (or vice versa). This physical arrangement takes advantage of the vertical dimension to provide better power, performance and area (PPA) scaling. The CFET architecture considered herein is based on the LGAA NS device architecture, which is nano-sheet stacked on nano-sheet. In conventional technology, that is, planar bulk and finFET, NMOS and PMOS are built and arranged side-by-side on the same plane of the Si wafer. CFET takes advantage of the vertical dimension to stack the NMOS on top of the PMOS (or vice versa). A vertical common gate between NMOS and PMOS replaces the horizontal gate running from N to P side to make the complementary functions of CMOS.

SUMMARY

The present disclosure relates to microelectronic devices including semiconductor devices, transistors, and integrated circuits, including methods of microfabrication.

A first aspect is a static random access memory (SRAM) structure. The SRAM structure can include a plurality of SRAM bit cells on a substrate, each SRAM bit cell including at least six transistors including at least two NMOS transistors and at least two PMOS transistors. Each of the at least six transistors can be lateral gate-all-around transistors in that the gate wraps all around a cross section of channels of the at least six transistors. The at least six transistors can be positioned in two decks in which a second deck is positioned vertically above a first deck relative to a working surface of the substrate. A first inverter can be formed using a first transistor positioned in the first deck and a second transistor positioned in the second deck. A second inverter can be formed using a third transistor positioned in the first deck and a fourth transistor positioned in the second deck, and a pass gate can be located in either the first deck or the second deck.

In some embodiments, each transistor can include multiple channels.

In some embodiments, a first portion of transistors can be formed with more channels relative to a second portion of transistors.

In some embodiments, an output of the first inverter can connect to an input of the second inverter.

In some embodiments, an output of the second inverter can connect to an input of the first inverter.

In some embodiments, the SRAM structure further includes a first ground voltage rail located at a top boundary of the SRAM cell, a second ground voltage rail located at a bottom boundary of the SRAM cell, and a supply voltage rail located in a middle of the SRAM cell.

In some embodiments, the pass gate can be located in the first deck, and wherein a cross-couple can be formed above the pass gate in the second deck.

In some embodiments, at least one NMOS transistor and at least one PMOS transistor can share a common vertical gate.

A second aspect is a static random access memory (SRAM) structure. The SRAM structure can include a plurality of SRAM bit cells on a substrate, each SRAM bit cell including at least six transistors including at least two NMOS transistors and at least two PMOS transistors. Each of the at least six transistors can be lateral transistors with channels formed from nano-sheets grown by epitaxy. The at least six transistors positioned in two decks in which a second deck can be positioned vertically above a first deck relative to a working surface of the substrate, wherein at least one NMOS transistor and at least one PMOS transistor share a common vertical gate. A first inverter can be formed using a first transistor positioned in the first deck and a second transistor positioned in the second deck A second inverter can be formed using a third transistor positioned in the first deck and a fourth transistor positioned in the second deck. A pass gate can be located in either the first deck or the second deck.

A third aspect is a method for forming a static random access memory (SRAM) bit cell on a substrate. The method includes forming at least six transistors including at least two NMOS transistors and at least two PMOS transistors, each of the six transistors being lateral transistors with channels formed from nano-sheets grown by epitaxy, the at least six transistors positioned in two decks in which a second deck is positioned vertically above a first deck relative to a working surface of the substrate, wherein at least one NMOS transistor and at least one PMOS transistor share a common vertical gate. The method includes forming a first inverter using a first transistor positioned in the first deck and a second transistor positioned in the second deck. The method includes forming a second inverter formed using a third transistor positioned in the first deck and a fourth transistor positioned in the second deck; and forming a pass gate located in either the first deck or the second deck.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1A:
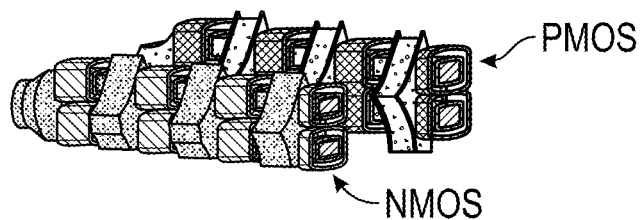
FIGS. 1A-1D show an example structure of PMOS and NMOS structure with common gates, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As the semiconductor industry transitions to a new device architecture, from finFET to lateral gate-all-around nanosheet (LGAA NS), there is a significant research focus on the complementary FET device architecture, or CFET.

Figure 1B:
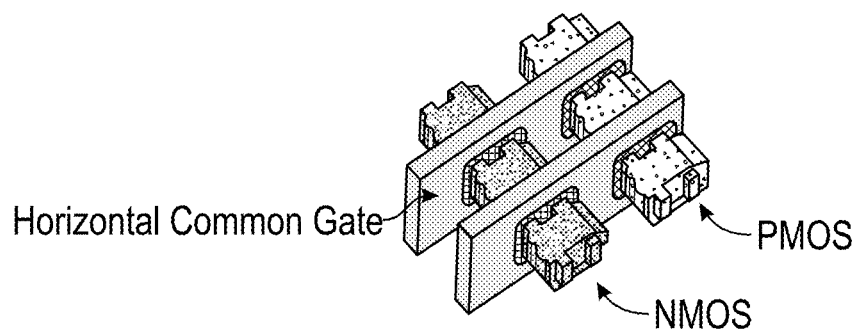
Figure 1C:
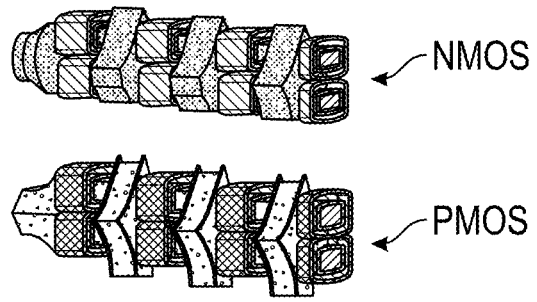
Figure 1D:
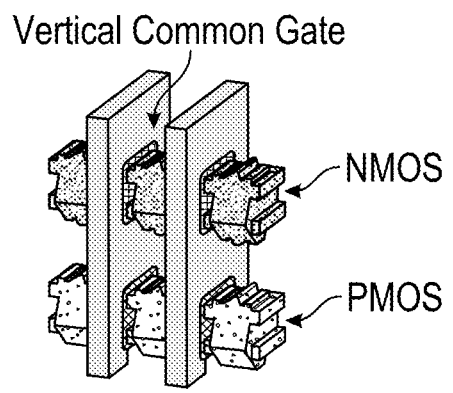

In FIGS. 1A-1D, CFET comprises stacking an NMOS device on top of a PMOS device (or vice versa). This physical arrangement takes advantage of the vertical dimension to provide better power, performance and area (PPA) scaling. The CFET architecture considered herein is based on the LGAA NS device architecture, which is nano-sheet stacked on nano-sheet. In conventional technology, that is, planar bulk and finFET, NMOS, and PMOS, are built and arranged side-by-side on the same plane of the Si wafer as shown in FIGS. 1A and 1B. CFET takes advantage of the vertical dimension to stack the NMOS, on top of the PMOS, (or vice versa) as shown in FIGS. 1C and 1D. A vertical common gate between NMOS and PMOS in FIG. 1D replaces the horizontal common gate running from N to P side to make the complementary functions of CMOS in FIG. 1B.

Any core device architecture, whether it is bulk planar or finFET, should enable two important families of CMOS circuits: logic standard cells and memory circuits such as SRAM. Techniques herein have a primary focus on embodiments of CFET to SRAM bit cells in particular.

SRAM memory is just as critical as logic standard cells in any chip design. Indeed, modem chips require increasingly more SRAM memory. For instance, it is not uncommon to see more than 50% of a total chip area used by on-chip memory. This highlights how important scaling SRAM memory is.

Besides the single transistor, the most fundamental unit structure of SRAM memory is the bit cell. The bit cell is the actual memory element. Typically hundreds of millions of bit cells are used together to form SRAM memory arrays.

Figure 2:
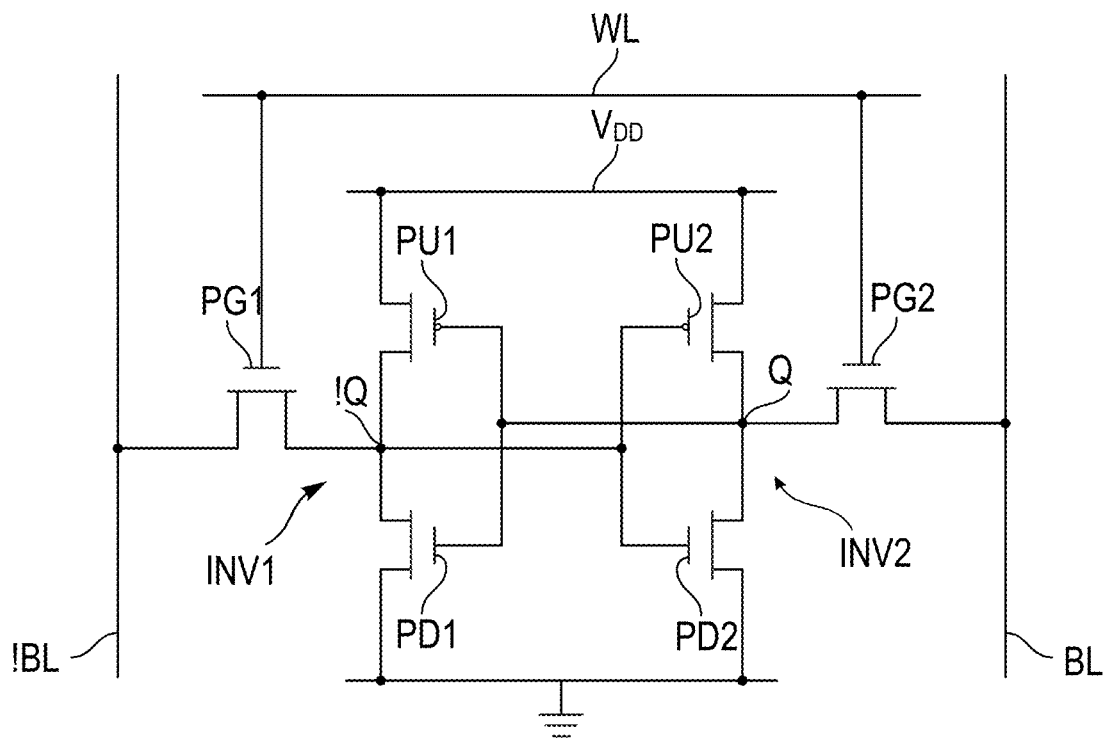
FIG. 2 shows a SRAM bit cell schematic consisting of six transistors, in accordance with embodiments of the disclosure.

In FIG. 2, an SRAM bit cell is typically made of 6 transistors, e.g., 4 NMOS and 2 PMOS (6 T bit cell). In some embodiments, the SRAM bit cell can be made of 6 transistors, e.g., 2 NMOS and 4 PMOS. The pass-gate device can be made with PMOS instead of NMOS. As is well known by one skilled in the art, these transistors are connected together to form two inverters, e.g., INV1 and INV2, (NMOS and PMOS sharing a common gate) latched together, that is, the output of one inverter is connected to the input of the other, and vice versa. Each output of each inverter is connected to another NMOS, called the pass-gate (PG), e.g., PG1 and PG2. The PMOS of each inverter is called the pull-up (PU), e.g., PU1 and PU2, and the NMOS of each inverter is called the pull-down (PD), e.g., PD1 and PD2. These common connection points between one inverter's output, the other inverter's input and the pass-gate source or drain are called internal nodes, Q and !Q (read "Q not" or "Q bar"). Description herein will refer to the inverter on the left as INV1 and the inverter on the right as INV2, leading to PU1/PD1/PG1, and PU2/PD2/PG2. In FIG. 2, access to the cell is enabled by the word line (WL) which controls the pass-gates: PG1 and PG2 which, in turn, control whether the cell should be connected to the bit lines: BL and !BL.

Figure 3A:
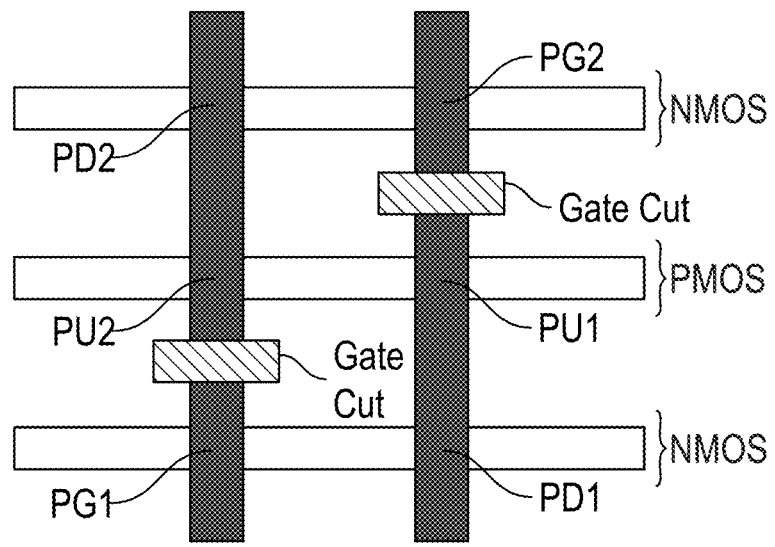
FIGS. 3A-3C show a layout view of bit cell designs, in accordance with exemplary embodiments of the disclosure.

FIG. 3A shows a simplified and idealized layout view of a bit cell design using finFET technology. The layout splits into three regions, e.g., NMOS region, PMOS region, and NMOS region. Each intersection of the simplified layout view of the three different bit cell designs represents pull-ups: PU1 and PU2, pull-downs: PD1, PD2, and pass-gate: PG1 and PG2. Gate cuts are located at between PU2 and PG1, and between PG2 and PU1.

Figure 3B:
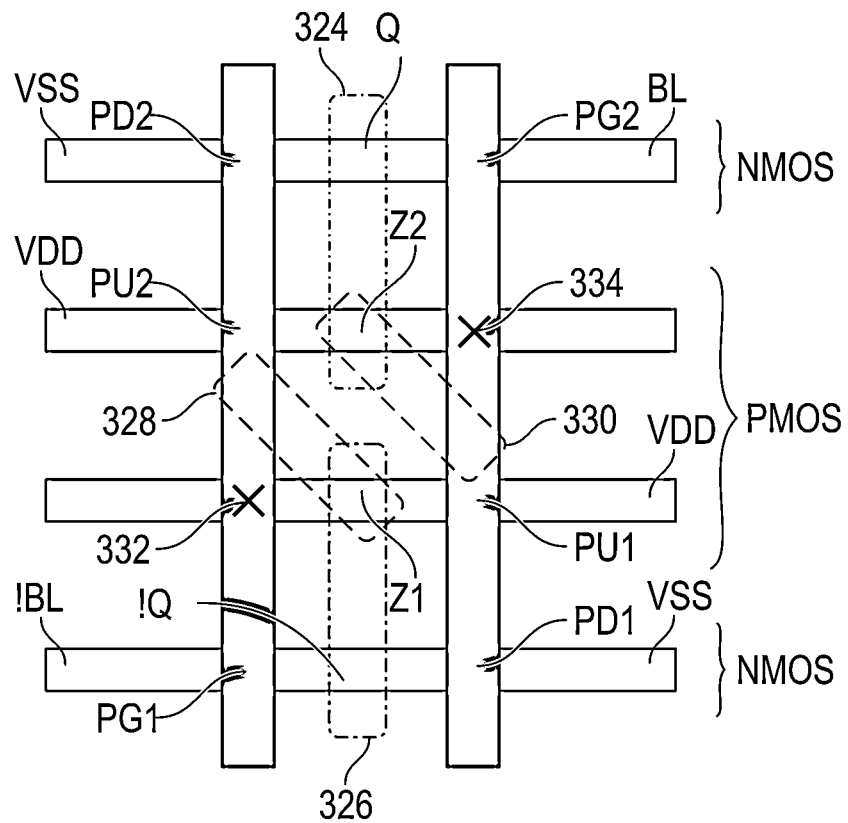
Figure 3C:
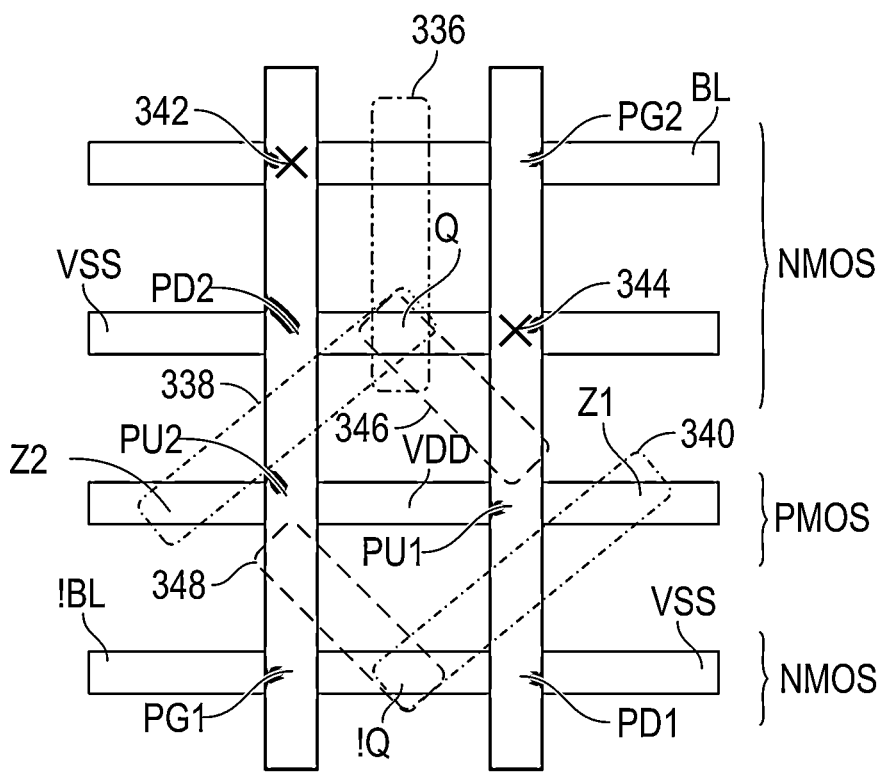

FIGS. 3B and 3C represent different, more realistic implementations of FIG. 3A layout. In FIGS. 3B and 3C, the vertical boxes and the vertical and right slanted boxes represent interconnects required to either connect the inverter output together and/or connect the pass-gate diffusion to it. The vertical boxes can be the boxes 324 and 326 in FIG. 3B. The vertical boxes can be the box 336 in FIG. 3C and the right slanted boxes can be the boxes 338 and 340 in FIG. 3C. The crosses, e.g., 332 and 334 in FIG. 3B and 342 and 344 in FIG. 3C, represent extra transistors that must be disabled or removed by process means. The left angle boxes, e.g., 328 and 330 in FIG. 3B and 346 and 348 in FIG. 3C, refer in particular to the cross-couple needed to connect the gate of INV1 to the output of INV2 in FIG. 3B and FIG. 3C and vice versa. There are many variants and options, some of which will be described subsequently. This illustrates some examples with conventional technologies. It should be noted that in FIG. 3B, the bit cell is represented with the fins running horizontally, in the typical conventions of logic standard cells. SRAM bit cells, however, are usually represented with a 90 degree rotation compared to FIG. 3C, that is, with fins running vertically. Thus, when looking at an SRAM array, it is organized with rows and columns of bit cells. Bit cells in one horizontal row have a common WL (word line) while bit cells in a vertical column have common BL (bit line) and !BL, as shown on FIG. 2.

In FIGS. 3B and 3C, the bit cell internal nodes are Q and !Q (read "Q not" or "Q bar"). Ground voltage is shown as VSS in FIG. 3B and FIG. 3C. Standby supply voltage is shown as VDD in FIG. 3B and FIG. 3C. The outputs of each inverter are called Z1 and Z2 in FIG. 3B and FIG. 3C.

The basic bit cell shape, or topology, is typically a rectangle made with two lines of gates, defining the width of the cell. With two gates, to obtain six transistors, one would need a minimum of three fins, defining the height of the cell. That would provide the minimum cell height possible, therefore the densest bit cell area. However, a three-fin design as shown in FIG. 3A is not possible as is well known for those skilled in the art.

As a brief description, in a three-fin design, separating the gates of PG1 and [PU2+PD2] and the gates of PG2 and [PU1+PD1] cannot be enabled by the process. There is simply not enough space. As shown in FIG. 3A, this separation is typically done in the process by printing a shape to cut the gate, and that requires space. Another process capability limiting the scaling of the height is the cross-couple connections, as indicated in FIGS. 3B and 3C by the left angle boxes. As seen in FIG. 2, the cross-couple is enabling the connection between the gate of INV1 to the output of INV2 and vice versa. As indicated in FIGS. 3B and 3C, this also requires space.

These reasons force the cell to use four fins instead of three as indicated by FIGS. 3B and 3C. Instead of creating just six transistors, there are now eight. Two extra transistors must be disabled or removed, as shown on FIG. 3B or 3C. With that basic bit cell topology established for conventional finFET technologies, scaling the cell height is scaling the fin pitch, and as is well known for those skilled in the art, the fin pitch scaling is close to an end.

Figure 4A:
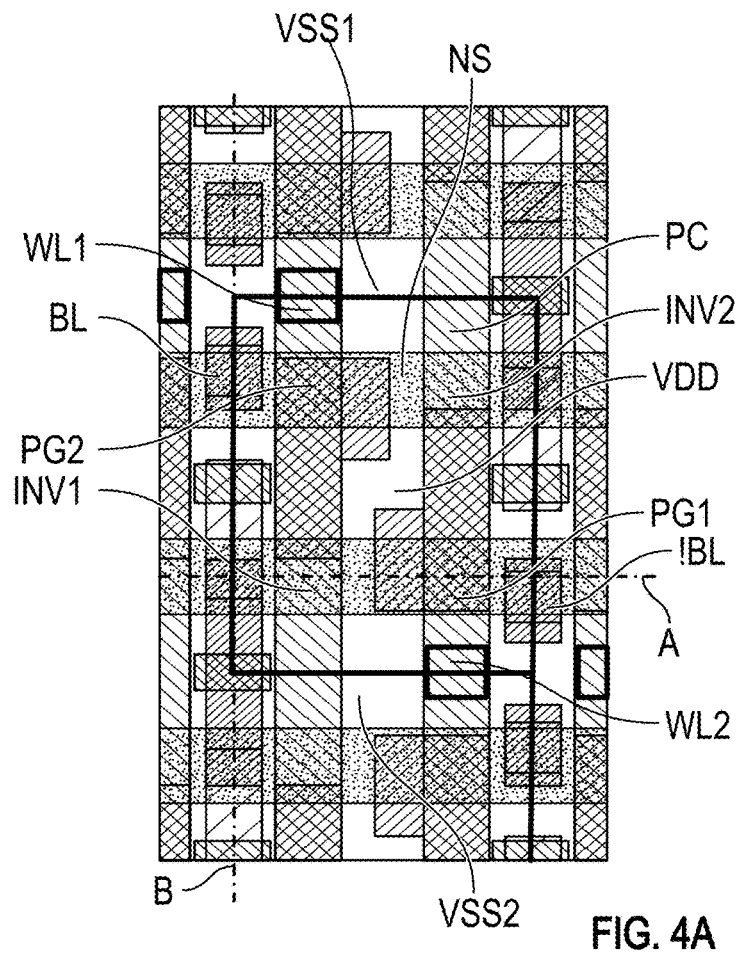
FIGS. 4A-4C show a CFET SRAM bit cell design and structure, in accordance with exemplary embodiments of the disclosure.
Figure 4B:
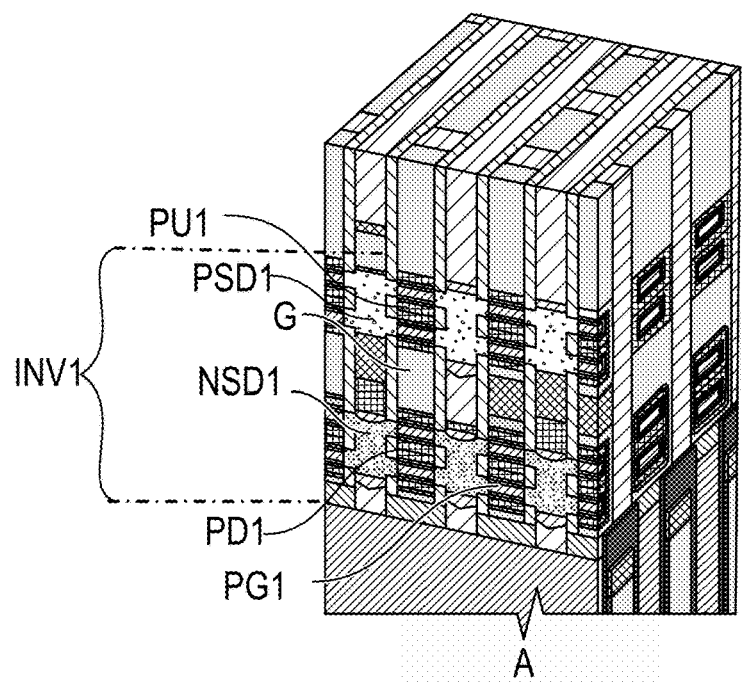
Figure 4C:
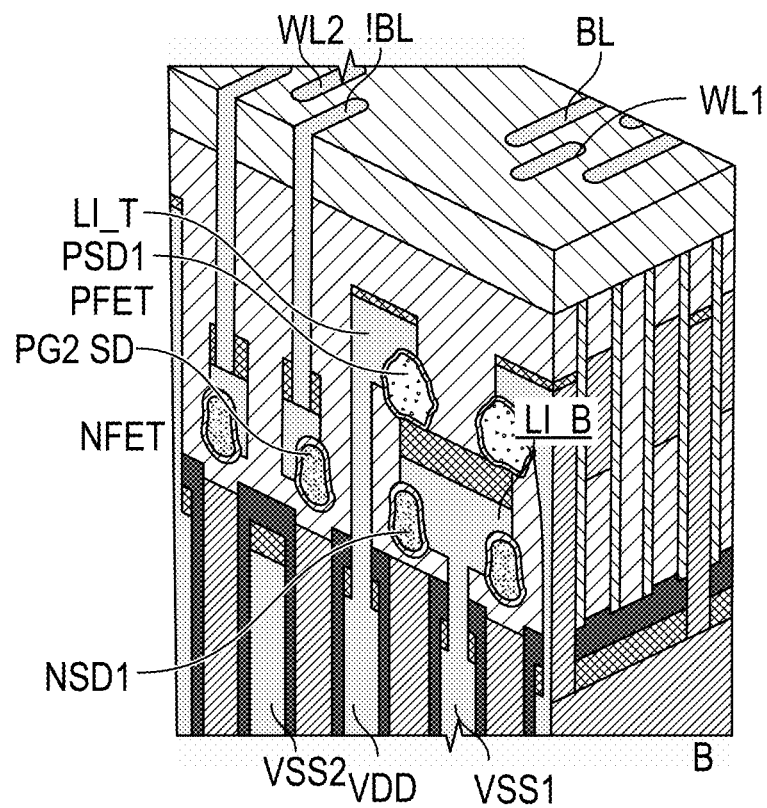

FIGS. 4A-C show the structure of a CFET SRAM bit cell made with two stacked levels of transistors. FIG. 4A is a top down view, or layout representation of the bit cell, while the others are 3D perspective cross-sectional views of a 3D structure of that circuit, highlighting the two stacked levels of transistors. Starting from the bottom of the stack, there is the NMOS level and then the PMOS level, or NP stack. In particular, the black outline box on the layout represents the unit bit cell boundaries. It should be noted that everything around that bit cell represents exactly identical bit cells of the array. Indeed, the array is typically built by duplicating multiple times the unit bit cell by left to right (or vice versa) symmetry and bottom to top (or vice versa) symmetry. Inside the bit cell boundaries, two horizontal nanosheet shapes (NS) can be seen representing the active layer or silicon channel, and two vertical shapes (PC) representing the gates. The intersection of two PC and two NS shapes typically creates a total of four devices, but with the two stacked devices of this CFET architecture, we have eight devices.

In cross-section A of FIG. 4A shown on FIG. 4B, the gate, e.g., G, sources and drains, e.g., NSD1 and PSD1, of each stacked devices are illustrated. Note especially, the first inverter, e.g., INV1, formed by the bottom NMOS first pull-down transistor PD1 and the top PMOS first pull-up transistor PU1 can be identified by its common gate G. Sharing the drain of the first pull-down transistor PD1 is another NMOS, which is a first pass-gate device PG1. Cross-section B of FIG. 4A shown on FIG. 4C illustrates in the other direction how the source and drain terminals of each stacked device are connected through local interconnects (LI_B, and LI_T) to the outside world, e.g., the top metal interconnect and the buried power rail (BPR). In particular, cross-section B in FIG. 4C represents a cross-section view of the sources and drains (SD) of the first pair of three devices: the source-drain (SD) of the second pass-gate PG2 SD, and the source-drain of bottom NMOS NSD1 and of top PMOS PSD1, part of the first inverter INV1 including a first pull-up transistor PU1, and a first pull-down transistor PD1 as referred to in FIG. 4A. While the second pair of three devices: the first pass-gate PG1 and the second inverter INV2, the second inverter including a second pull-up transistor PU2 and a second pull-down transistor PD2), which is essentially a mirrored image of cross-section B obtained by flipping left to right and then bottom to top based on FIG. 4A. Other devices are visible but not labelled as they belong to adjacent bit cells. It should be noted that LI_B and LI_T interconnects are capped by a selectively deposited dielectric layer.

As can be seen also in the layout view of FIG. 4A, the bit cell contains three buried power rails: two VSS rails, e.g., VSS1 and VSS2, at the top and bottom boundaries of the cell, and one VDD rail in the middle of the cell, as can be seen in cross-section B of FIG. 4A shown on FIG. 4C.

Two word lines are shown in FIG. 4C as WL1 and WL2. Bit lines are shown in FIG. 4C as BL and !BL. PFET and NFET labels on FIG. 4C indicate where the top PFET and bottom NFET devices are located in the stack.

Where conventional designs require a minimum of four active shapes, or four fins in the case of finFET, this 2-deck CFET design is formed with two active shapes, or the equivalent of two fins. Indeed, typically for SRAM designs, density is favored against drive strength, therefore narrow nanosheets with width between 5 to 30 nm can be used. A significant reduction of the bit cell height can therefore be obtained herein.

Lateral separation of the gates enables devices herein to function properly. As seen in FIG. 3, in conventional designs where all the devices are located in the same horizontal plane (the wafer plane), the devices are spread out enough that it is relatively straightforward to cut the gates where needed. As indicated, an SRAM memory is an array with multiple bit cells organized in rows and columns. Because gate are continuous lines resulting from the process, one gate line will run across multiple bit cells located in the same row (gate orientation) of the array.

Accordingly, all inverters of each bit cell sharing the same gate line will have a common gate and this is not viable. Identified herein, there is a need to separate the gate of one cell's inverter from the adjacent cell's inverter, as is well known for those skilled in the art.

On the other hand, the pass-gate devices located in the same row ultimately share the same gate, the word line, as seen in FIG. 2.

Figure 5A:
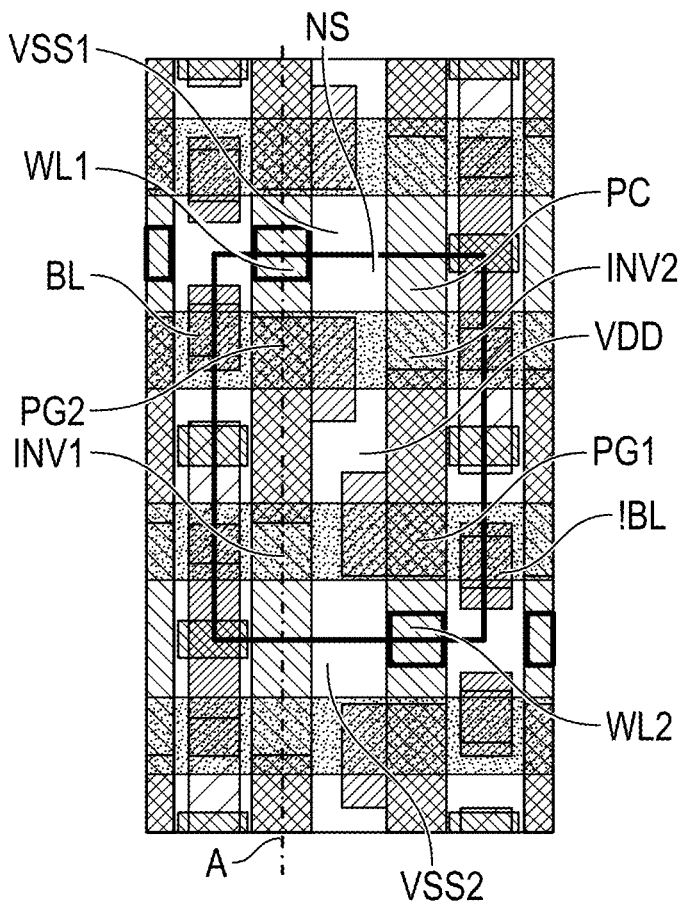
FIGS. 5A-5B show a CFET SRAM bit cell design and structure, in accordance with exemplary embodiments of the disclosure.

This is reconciled herein. FIG. 5A shows the same layout of FIG. 4A but with cross-section A located inside and along the gate line.

Figure 5B:
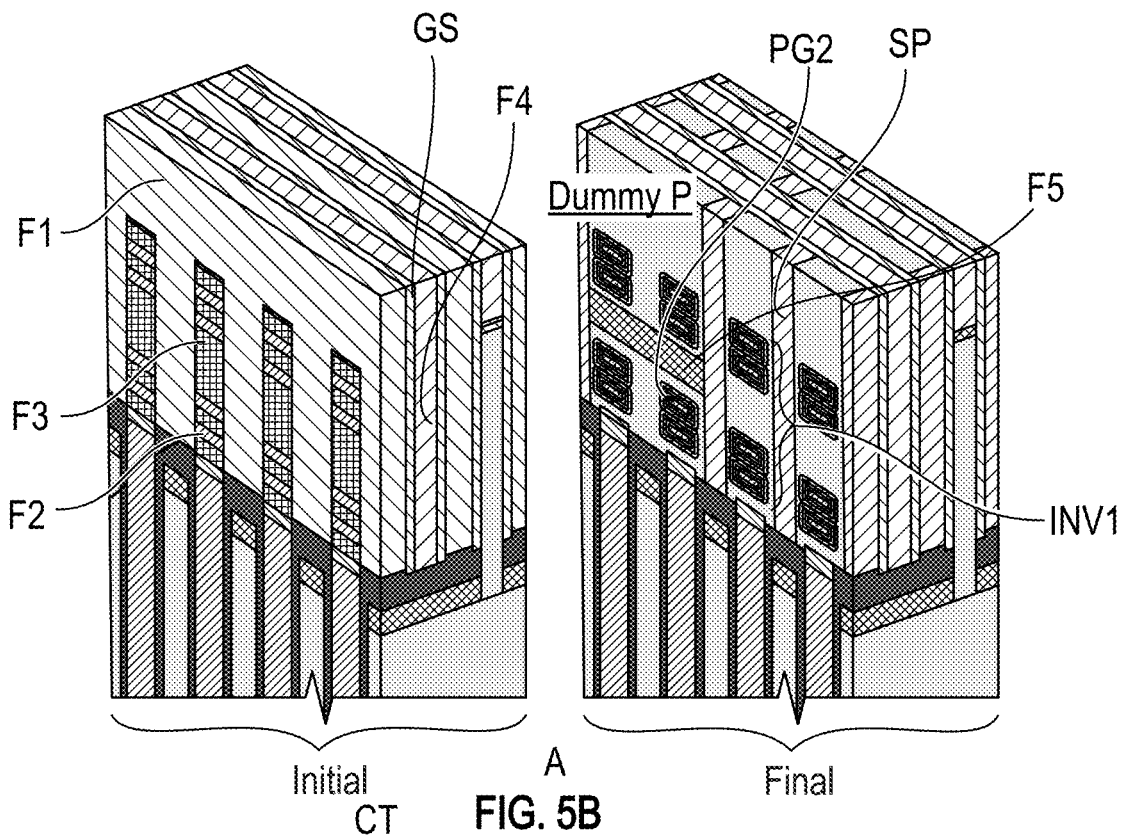

The cross-section on the left of FIG. 5B shows an initial structure with a first fill material F1, and the first fill material F1 may be dummy gate material. Following conventional processing, when the replacement metal gate (RMG) module completes, it will form a single common gate across the row and across the different devices in the stack. The cross-section on the right of FIG. 5B shows a final desired outcome. As illustrated, the gate for the first inverter INV1 is separated from the adjacent cell's inverter, and is also separated from the second pass-gate PG2. Neighboring pass-gates, one belonging to one cell and one to an adjacent cell, share a common gate. It should be noted that the common word line WL is usually a metal line running above at Ml, running across the multiple cells of the row, with gate contacts regularly dropping down to connect the pass-gates. Techniques herein take advantage of the symmetry inside the array to ease the patterning of those word line gate contacts. In the cross-section of the initial structure in FIG. 5B, a second fill material F2 is filled in between a third fill material F3. The second fill material F2 may be silicon and the third fill material F3 may be silicon germanium. A fourth fill material F4 may be filled on the side of the initial structure in FIG. 5B. The fourth fill material F4 may be oxide. Gate spacer GS may be between the first fill material F1 and the fourth fill material F4.

In the cross-section of the final structure in FIG. 5B, separation pillars SP may be formed between inverters, e.g., INV1, etc.

Regarding the pass-gates, they are made using the bottom NMOS of the stack. And as can be seen on the cross-section of the final structure in FIG. 5B, the gates of the pass-gates, e.g., PG2, are vertically separated from the gates of the PMOS devices on top by the fifth fill material F5. The fifth fill material F5 may be dielectric material. As indicated earlier, eight devices are created in this construct, but only six are required to form the SRAM bit cell. These two PMOS devices sitting on top of the NMOS pass-gates are dummy devices Dummy P. The fifth fill material F5 may be filled between the second pass-gate PG2 and dummy P.

Figure 6A:
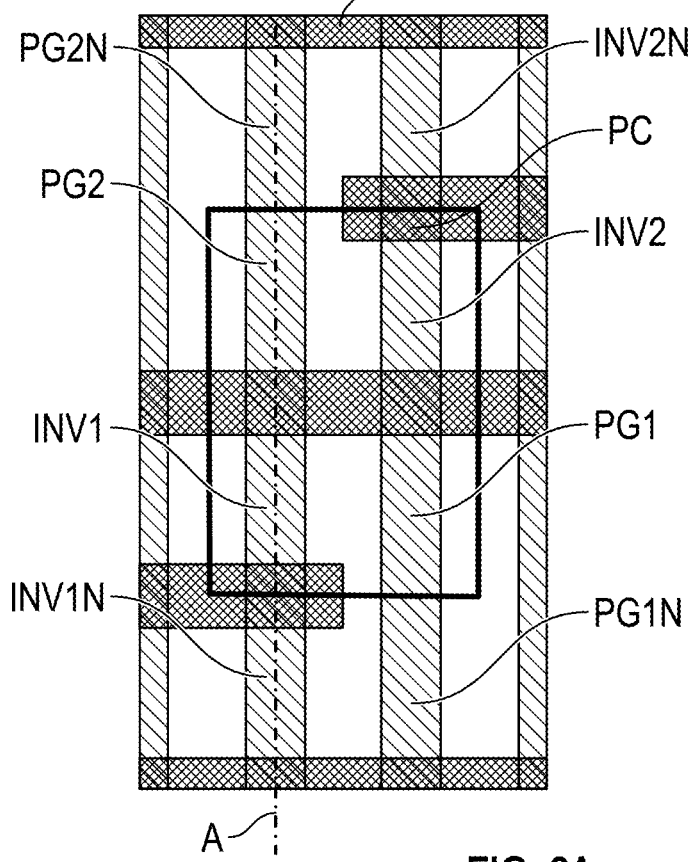
FIGS. 6A-6B show a CFET SRAM bit cell design and structure, in accordance with exemplary embodiments of the disclosure.
Figure 6B:
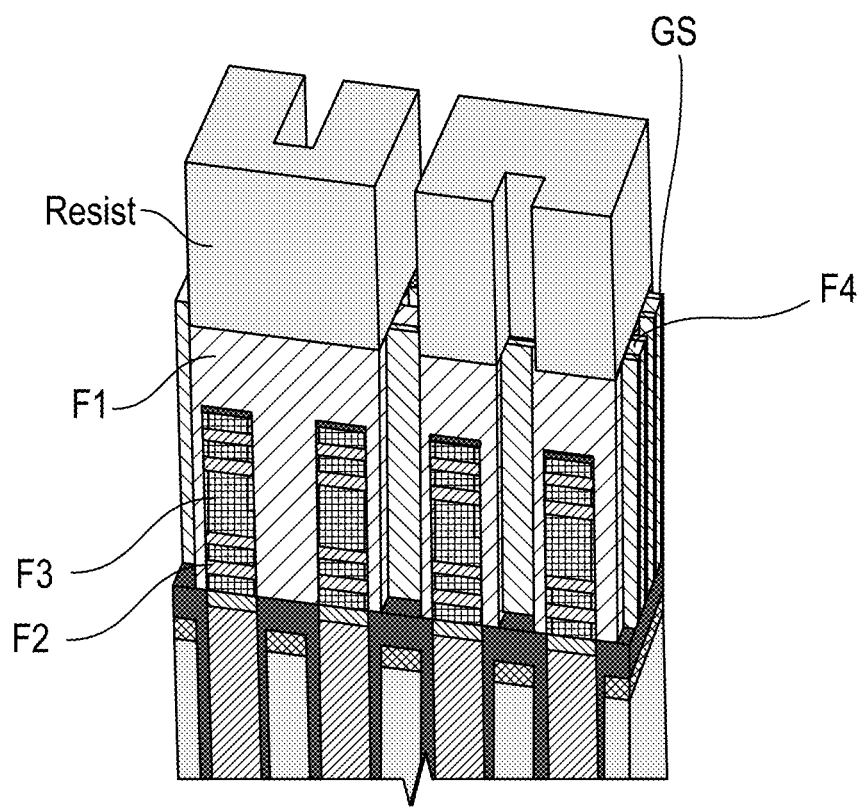

FIG. 6A shows an important patterning layer used to obtain the desired state of gate separation. The layout is the same as in FIG. 5A but only the gate layer PC and CT layer are shown. CT layer is beneficial here to achieve the lateral gate separation indicated previously. As can be seen on the layout and on FIG. 6B (cross-section A of FIG. 6A), CT layer runs perpendicular to the gates and is at the cell boundaries and in the middle of the cell. The goal of CT layer is to insert a dielectric separation in these locations only. As shown in cross-section A of FIG. 6A on FIG. 6B, the dummy gate material F1 in these locations must be removed first.

Figure 7A:
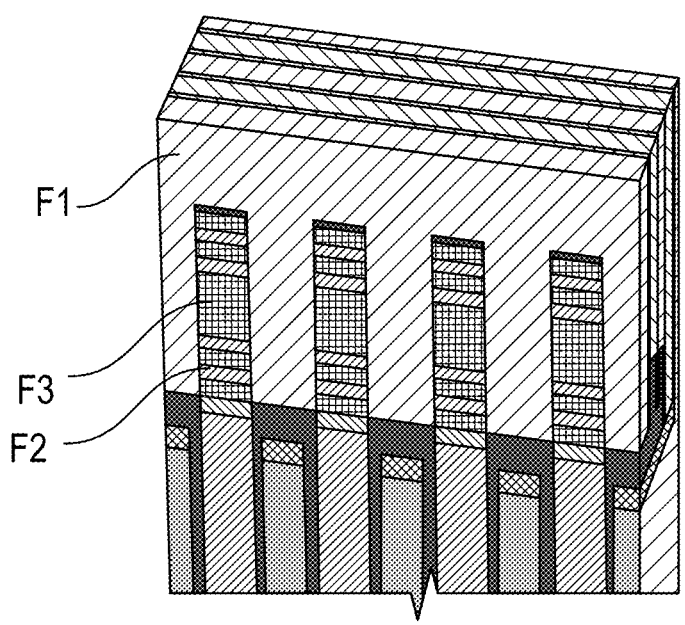
FIGS. 7A-7E show a formation of lateral gate separation, in accordance with exemplary embodiments of the disclosure.
Figure 7B:
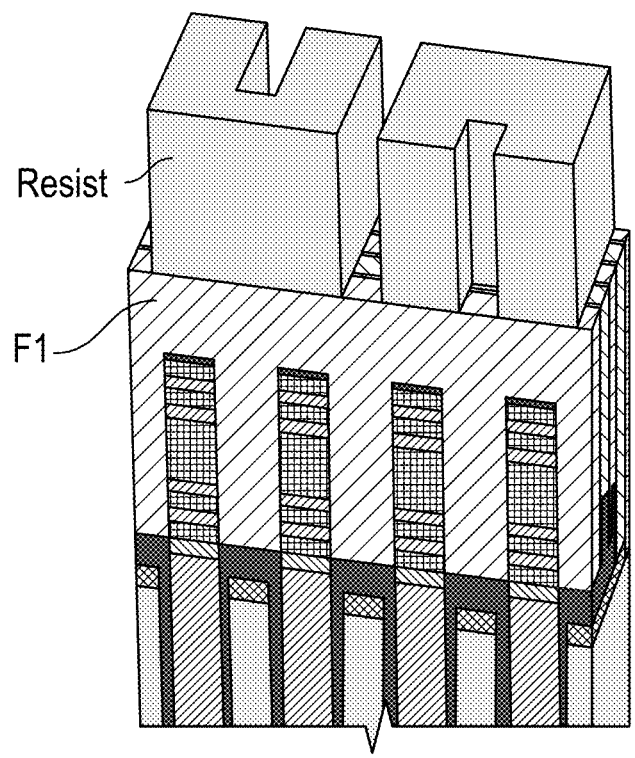
Figure 7C:
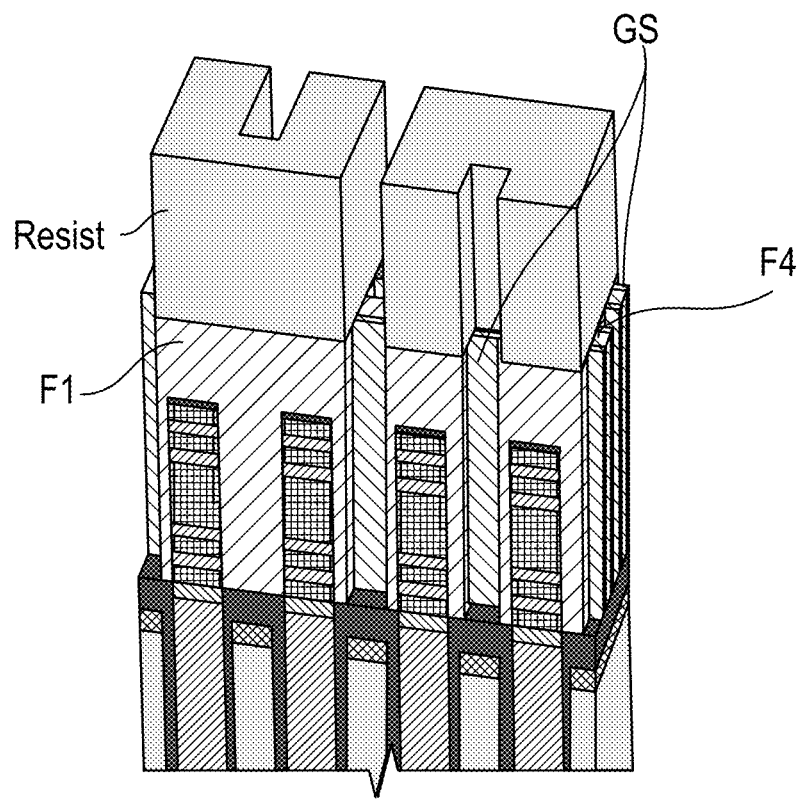
Figure 7D:
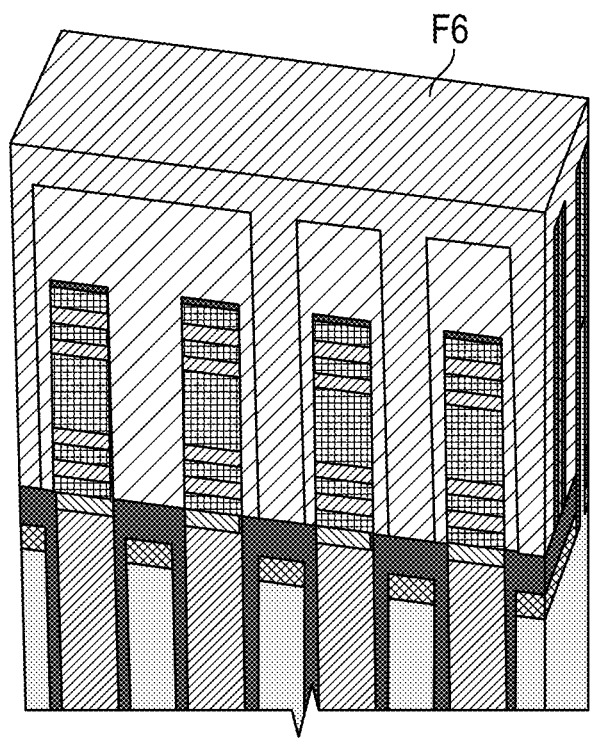
Figure 7E:
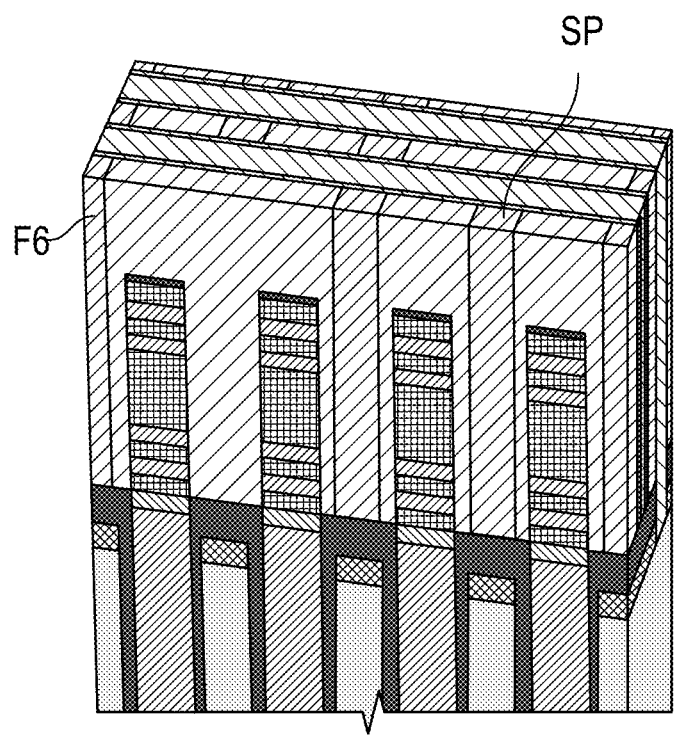

A more detailed flow is presented in FIGS. 7A-7E. Once the surface is planarized by chemical mechanical planarization (CMP) to expose the dummy gate material F1, CT is patterned so the exposed first fill material F1 can be removed by anisotropic and selective etch as shown in FIGS. 7A-7C. As can be seen, the gate spacer GS and the oxide F4 exposed in the source and drain area are not etched due to the selectivity, making the etch self-aligned. The resist is then stripped, and the created cavity can then be filled by a fill material F6 in FIG. 7D, followed by a CMP step in FIG. 7E. The fill material F6 may be silicon nitride, or the like. As is well known for one skilled in the art, these steps so far are conventional for a replacement metal gate (RMG) module. The separation pillar SP of FIG. 5B is built, and has a full height.

The shape of CT enables to form a pillar to separate the gate of the first inverter INV1 from inverters of adjacent cells INV1N but also from the gate of the second pass-gate PG2. CT also enables not to form a pillar between the gates of adjacent pass-gates, as required since the pass-gates in the same row share the same word line.

Figure 8A:
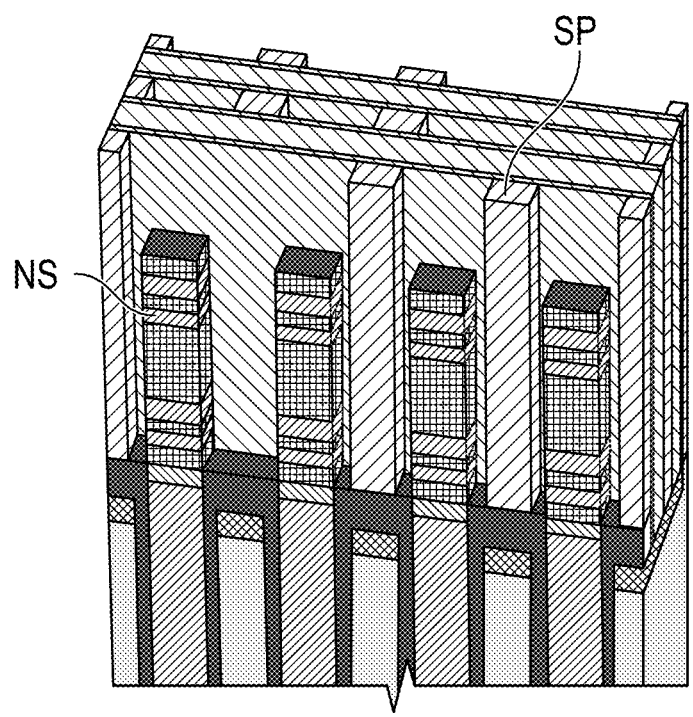
FIGS. 8A-8C show a formation of lateral gate separation, in accordance with exemplary embodiments of the disclosure.
Figure 8B:
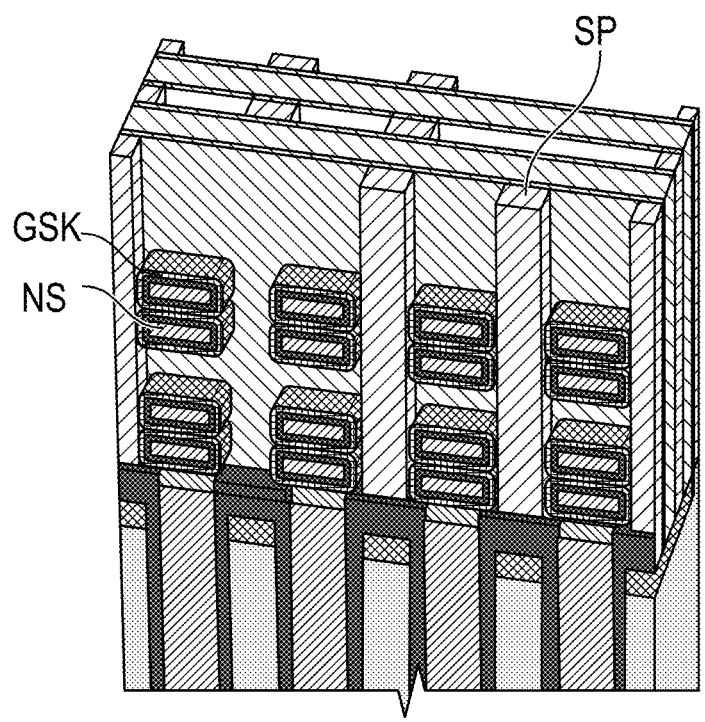
Figure 8C:
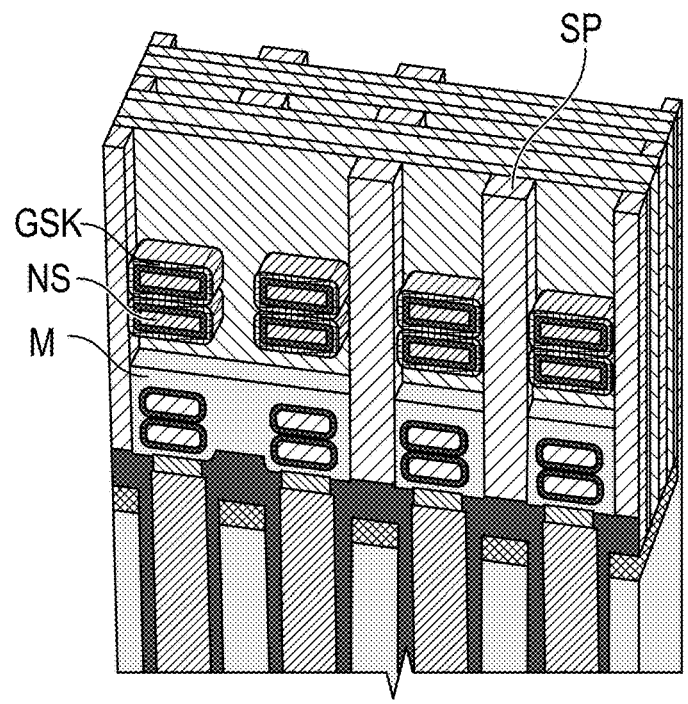

Continuing in FIGS. 8A-8C, once the separation pillar SP is defined, the RMG flow can be resumed. The dummy gate material or the first fill material F1 is removed and the gate stack GSK can be formed around the nano-sheets. It should be noted that as can be seen in FIG. 8B, the interfacial layer/high-k dielectric (IL/HK) is formed selectively on the Si nano-sheets NS and similarly, the work function metals are also formed selectively on the HK.

While this provides tighter integration and better tolerance for edge placement error, it should be noted that this lateral gate separation is compatible with non-selective depositions approaches. Once the gate stack GSK is formed, the final metallization M of the bottom NMOS can follow as shown in FIG. 8C.

The next phase is to provide vertical gate separation only between the bottom NMOS forming the pass-gates and the PMOS devices on top of them, but not between the NMOS and PMOS forming the inverter. As indicated earlier, this construct creates eight devices in the bit cell, out of which only six are needed for the bit cell. These two PMOS devices on top of the pass-gates are extra, or dummy devices, as indicated on the right of FIG. 5B, and must be removed.

Figure 8D:
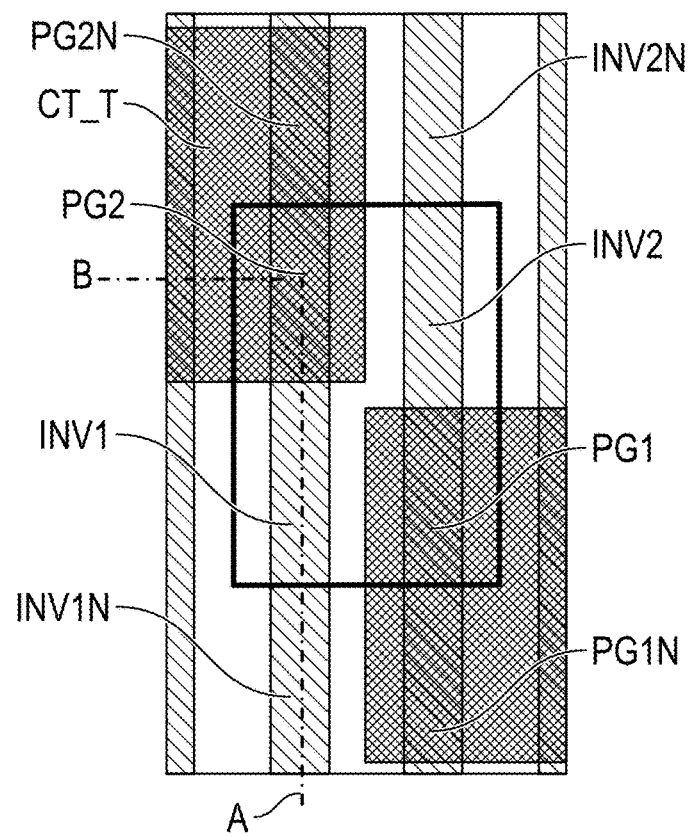
FIGS. 8D-8F show a formation of the vertical separation between the bottom NMOS of the pass gates and the dummy PMOS devices on top and use of CT_T layer, in accordance with exemplary embodiments of the disclosure.
Figure 8E:
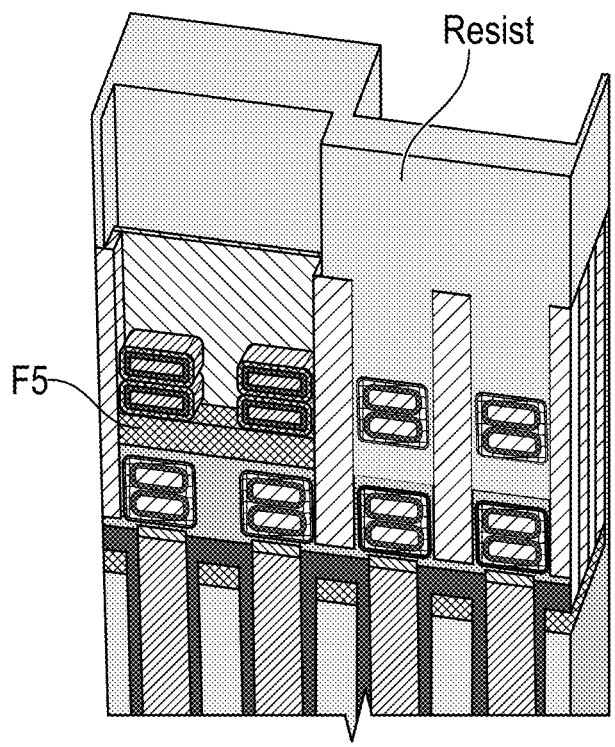
Figure 8F:
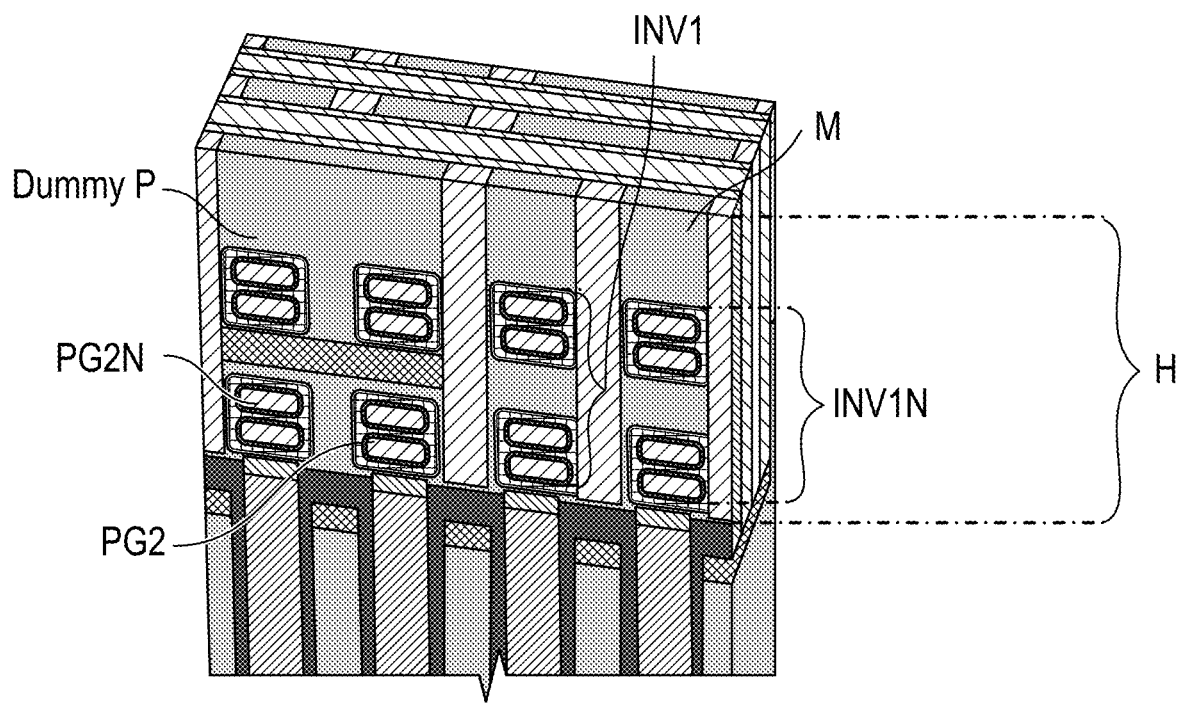

The next step towards this is shown in FIGS. 8D-8F as another patterning step is used. The layout view in FIG. 8D highlights how the CT_T layer shapes cover the pass-gates locations. By using a negative tone of CT_T, these pass-gates areas are now exposed, as shown in FIG. 8E in cross-section A. One skilled in the art will recognize that that the patterning techniques shown here are simplified examples and that other combinations of resist and mask tone are possible. For example, printed patterns can alternatively be the result of printing CT_T from the layout with a negative tone resist, e.g., the exposed areas of the resist would cross-link and remain after development, while the non-exposed areas would be dissolved and removed, uncovering the areas of interest. Once the area is uncovered, the fifth fill material F5, e.g., a dielectric film, is selectively deposited on the final metal of the pass-gates as seen on 8E, the thickness of this film ranges from 5 to 50 nm. Finally in FIG. 8F, the resist is removed and the final metallization M of the top PMOS devices is completed, followed by CMP which defines the final pillar height H. In FIG. 8F, pass-gate adjacent to the second pass-gate may be called PG2N. Another inverter adjacent to the first inverter INV1 may be called INV1N.

It should be noted that the vertical separation between bottom NMOS and top PMOS is provided for during the initial active stack formation. Indeed, the third fill material F3, e.g., SiGe layer, separating the bottom NMOS and top PMOS is thicker (5-50 nm) to act as a vertical separation and a process cushion.

The cross-couple is the next important aspect of embodiments herein. As illustrated in FIG. 3A, even on conventional designs, to provide the connections required in FIG. 2, specific interconnects are used, as shown by the boxes. The vertical, e.g., 324, 326, 336, and angle-right boxes, e.g., 338, 340, are used to either connect the inverter output together and/or connect the pass-gate diffusion to it. The angle left boxes, e.g., 346 and 348, refer in particular to the cross-couple needed to connect the gate of INV1 to the output of INV2 and vice versa. This cross-couple construct is beneficial in designing efficient dense SRAM bit cell.

Given the 3D nature of this structure, the level of connectivity needed will now be described. There are two distinct phases enabling the connectivity. This includes providing access to the internal nodes of the bit cell, as well as connecting them together. As such, phase 1 includes partially clearing a top section of the structure by removing the dummy PMOS devices on top of the pass-gate NMOS devices as indicated in FIG. 8F, so phase 2 can happen.

Figure 9A:
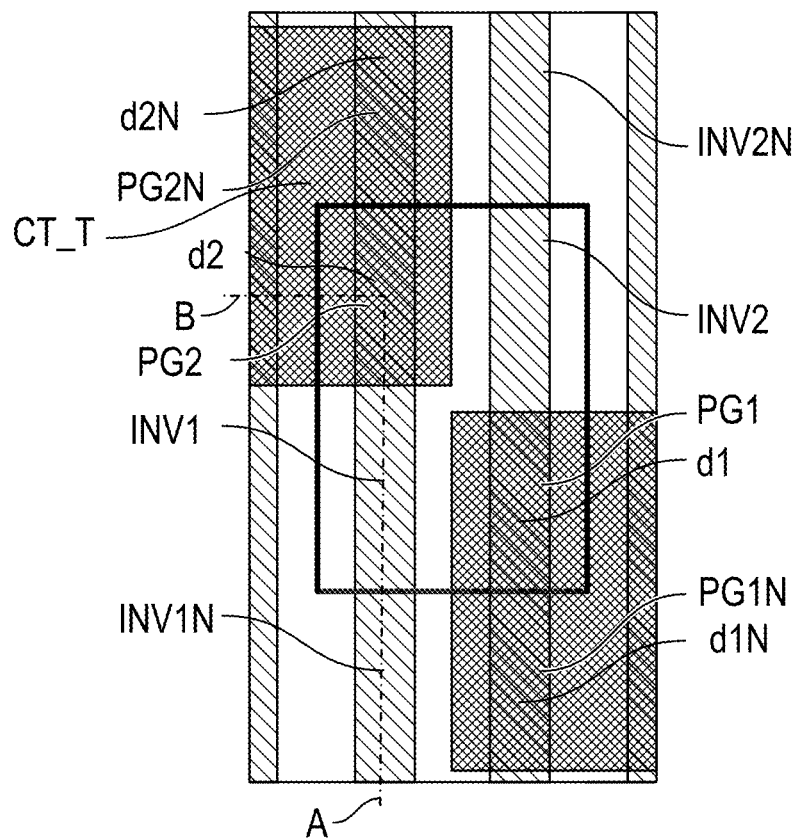
FIGS. 9A-9D show a formation of cross-couple, in accordance with exemplary embodiments of the disclosure.
Figure 9B:
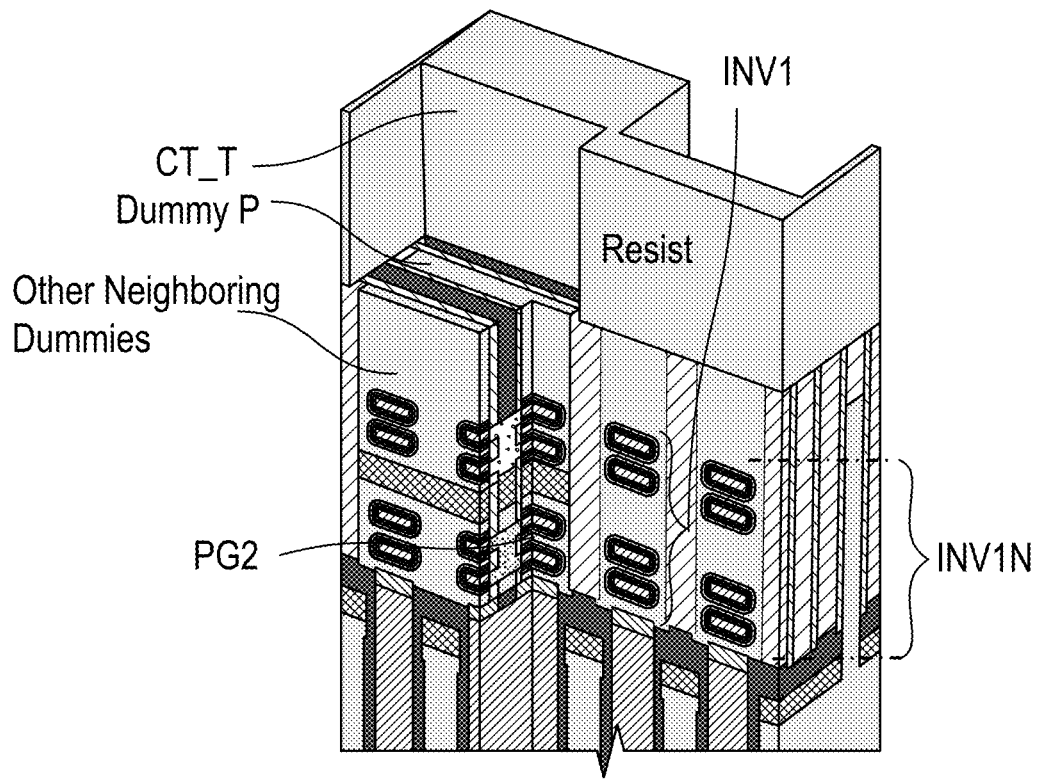

FIG. 9A shows formation of the cross-couple 1/3. Phase 1 consists in removing the dummy PMOS devices, e.g., d1, d1N, d2, and d2N, on top of bottom NMOS pass-gate devices. Elements d1 and d2 are the dummy devices 1 and 2 that are removed (only 2 per bit cell). Note that because of the symmetrical nature of a bit cell array, FIG. 9A shows neighboring cells around the bit cell of interest, and so the neighbor ("N") dummy device 1 is called d1N and the neighbor dummy device 2 is called d2N, as shown in FIG. 9A. The first pass-gate PG1, the second pass-gate PG2, the first inverter INV1, and the second inverter INV2 refer to devices of the bit cell of interest. The neighbor device of the first pass-gate is called PG1N. The neighbor device of the second pass-gate is called PG2N. The neighbor device of the first inverter is called INV1N and the neighbor device of the second inverter is called INV2N. these devices refer to devices of adjacent cells partially visible in the cross-sections and 3D views. After the structure is planarized by CMP, the layer CT_T is used again in the same manner to uncover the pass-gate areas as described in FIG. 9B. Alternative flows can be used that avoid using CT_T twice, for example.

Figure 9C:
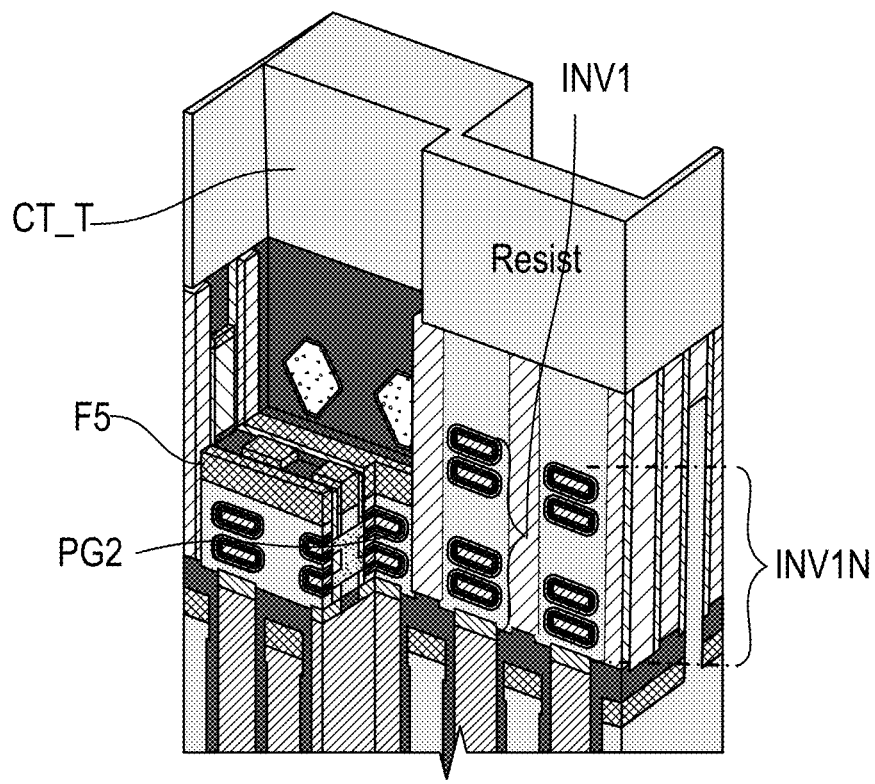

As can be seen in FIG. 9C and as defined by CT_T, a section is removed by an anisotropic etch, effectively removing the top dummy devices. The etch removes exposed materials of the gate stack such as metals, dielectrics and silicon. In particular, Ru, TiN, TiAl, HK and silicon are etched away. The silicon oxide or the fourth fill material F4 and the gate spacer material (e.g., SiN, SiON, SiCN, SiCON, etc.) are etched as well. The fifth fill material F5, e.g., dielectric layer, providing the vertical separation between the gate of the NMOS devices and the gate of the top dummy PMOS devices, as described in FIG. 8F, acts as an etch stop layer. This etch can have a combination of multiple etchants and/or be done in sequence.

Figure 9D:
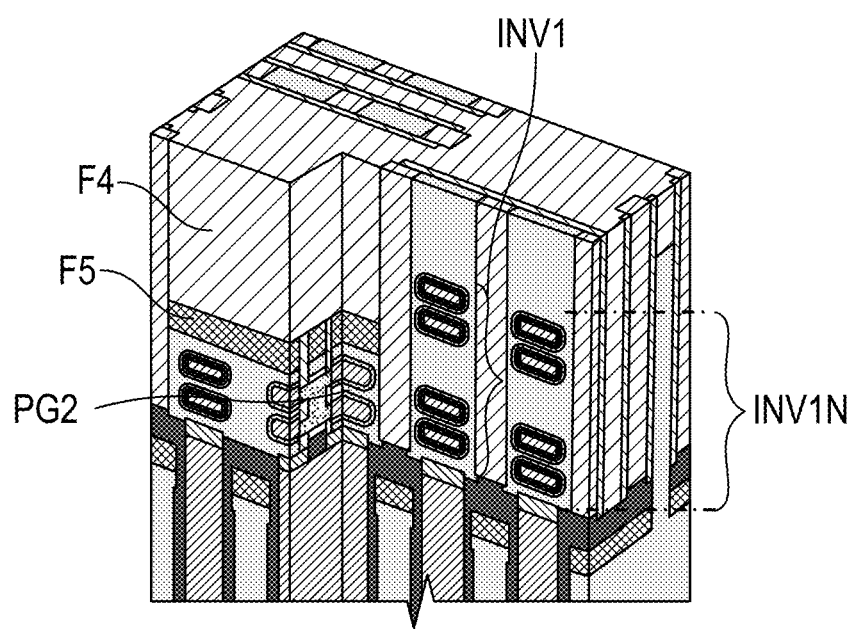

It should be noted that while FIG. 9C shows minimum over etch of the oxide or the fourth fill material F4 and gate spacer material, it is also possible to expect more over etch, to the point where the local interconnects of the source and drain of the bottom NMOS can be exposed. The dielectric cap on these interconnects functions as an etch stop layer. This would still not be a problem because the structure is filled with the fourth fill material F4 or oxide again, then planarized by CMP as illustrated in FIG. 9D.

Figure 10:
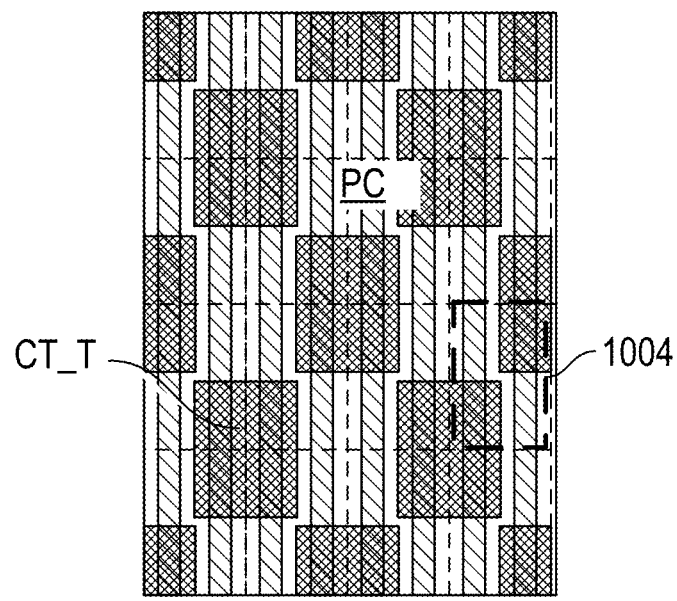
FIG. 10 shows a layout view of an SRAM bit cell array, in accordance with exemplary embodiments of the disclosure.

Due to the symmetrical and repetitive nature of the bit cells organization, the CT_T layer is symmetrical and repetitive as well, along the cell boundaries. This is partially represented on the layout where CT_T top shape extends to the left adjacent cells, and CT_T bottom shape extends to the right adjacent cells. FIG. 10 represents a zoomed out layout view of an SRAM bit cell array showing how CT_T is shaped across an array. Each bit cell is represented by a black outline box, e.g., 1004. This completes phase 1. The structure is now ready for phase 2 and the actual implementation of the cross-couple.

Figure 11A:
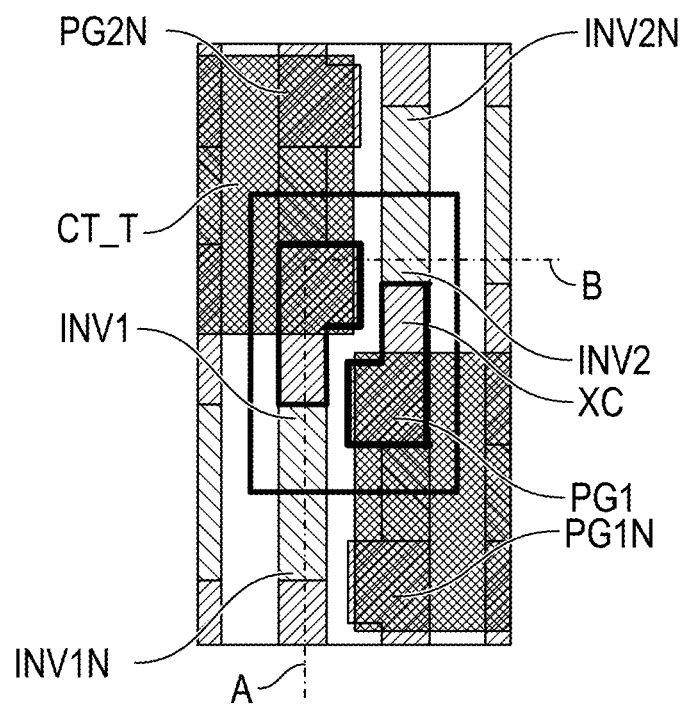
FIGS. 11A-11E show a formation of cross-couple, in accordance with exemplary embodiments of the disclosure.
Figure 11B:
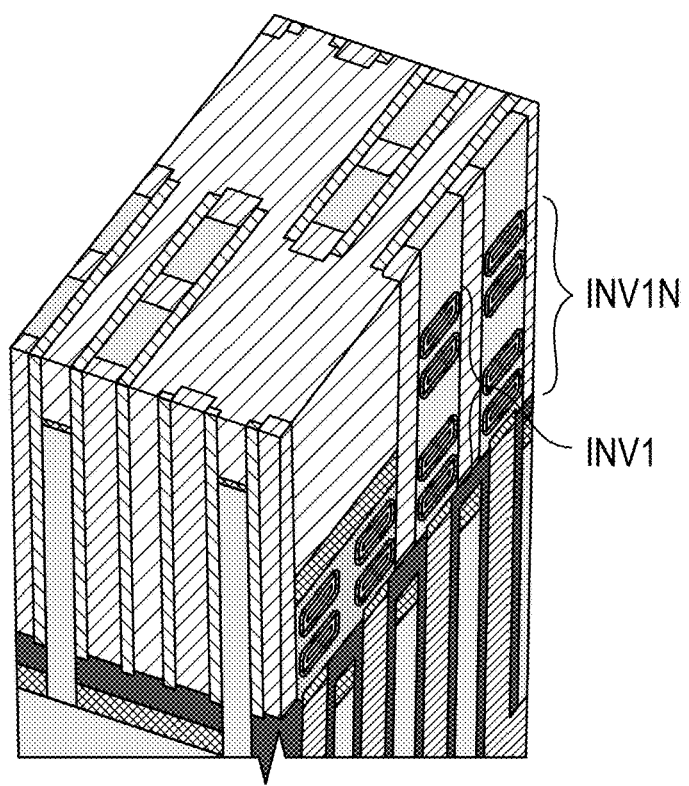
Figure 11C:
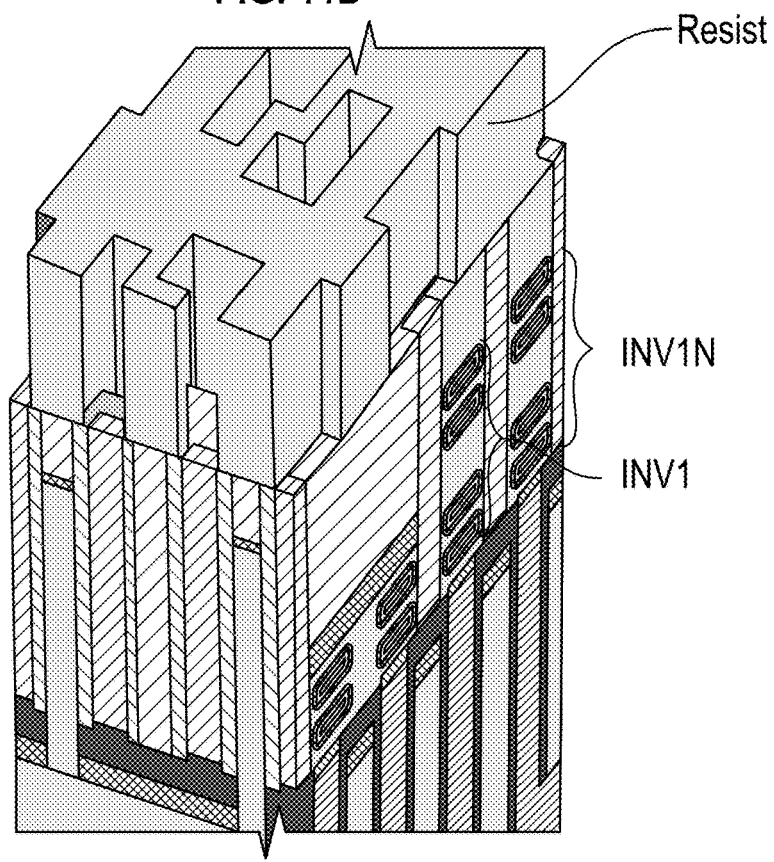
Figure 11D:
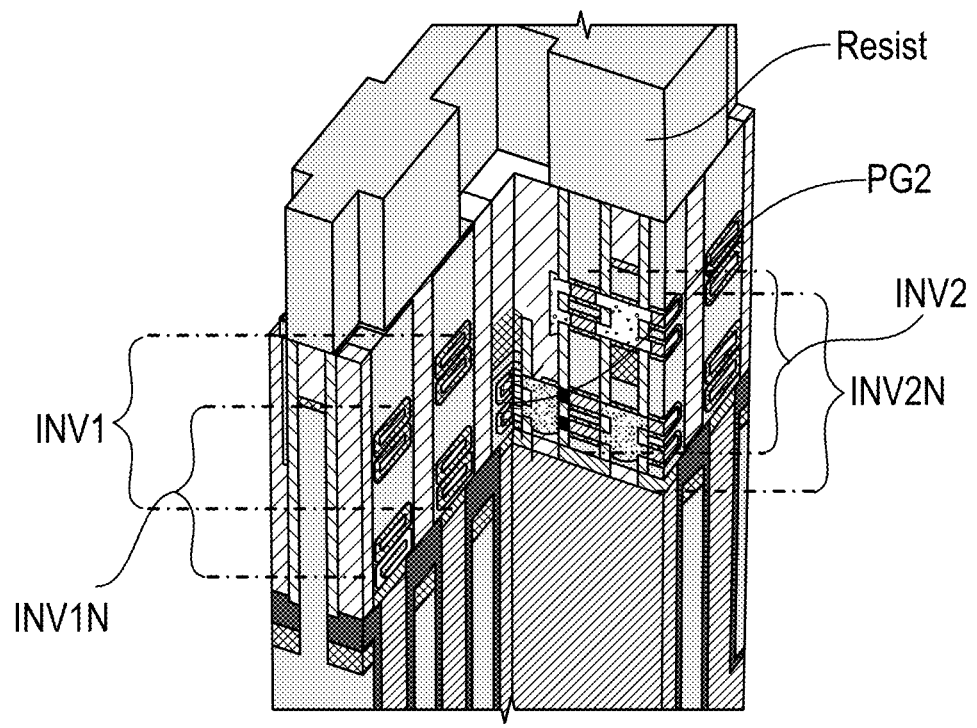

FIG. 11A shows formation of the cross-couple 2/3. Phase 2 is the formation of the cross-couple. As mentioned earlier, PG1N, PG2N, INV1N and INV2N refer to devices of adjacent cells partially visible in the cross-sections and 3D views. FIG. 11B resumes the flow from FIG. 9D. The layout view in FIG. 11A is the same but adds the cross-couple layer XC. Starting from FIG. 11B, XC is then patterned in FIGS. 11C and 11D. FIG. 11D shows the same step as FIG. 11C, but shows a different view inside, to better illustrate the XC patterning, following the A-B cross-section as shown on the layout view of 11A. The layout view also points where the different pass-gate and inverters are located to indicate orientation. In particular, as discussed before, the views presented center on a bit cell, but some devices of adjacent cells all around are partially visible. In particular, PG1, INV1 and PG2, INV2 represent the active devices of the bit cell of interest, as presented in FIG. 2, while PG1N, PG2N, INV1N and INV2N represent the active devices of adjacent cells when visible, as mentioned earlier.

Figure 11E:
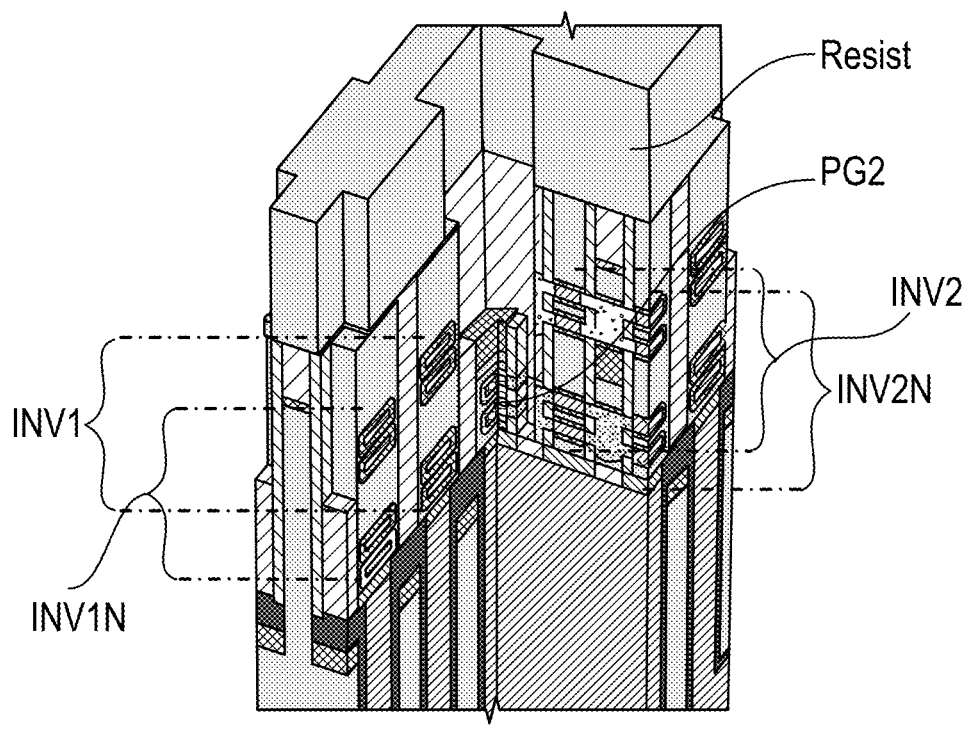

As seen in FIG. 11D, the cross-couple layer XC opens access to a portion of the areas cleared by CT_T. Also notice that the cross-couple layer XC opens access to a portion of the top of the first inverter INV1 gate. The neighbor inverter of the second inverter is indicated by INV2N. The neighbor inverter of the first inverter is indicated by INV1N. The next step is the cross-couple layer XC etch. The etch has multiple objectives. It must uncover the side of the gate of the first inverter INV1 and it must uncover the side of the source or drain of the second pass-gate PG2 and the side of the sources or drains of the second inverter INV2 for both NMOS and PMOS. This is what is shown in FIG. 11E.

FIG. 12 shows the same steps but focused on cross-section B to better illustrate the cross-couple layer XC etch. The cross-couple layer XC etch can be done in multiple anisotropic etch sequences even though this illustrates it in two simplified steps.

Figure 12A:
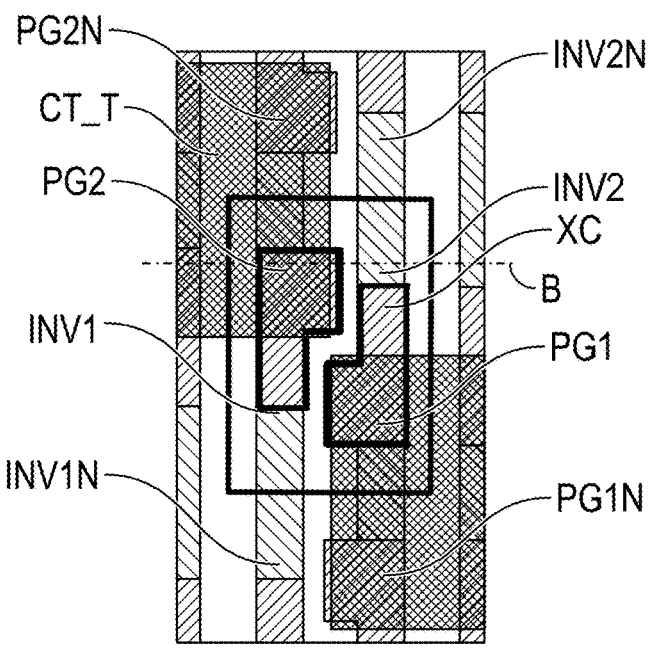
FIGS. 12A-12E show a formation of cross-couple, in accordance with exemplary embodiments of the disclosure.
Figure 12B:
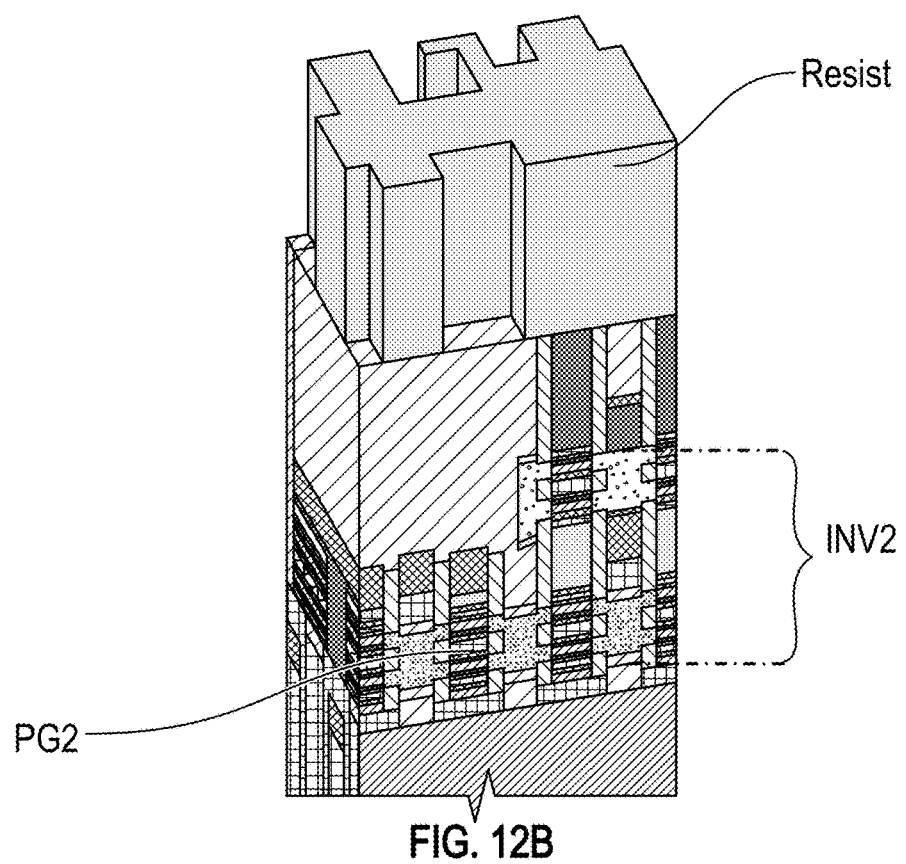
Figure 12C:
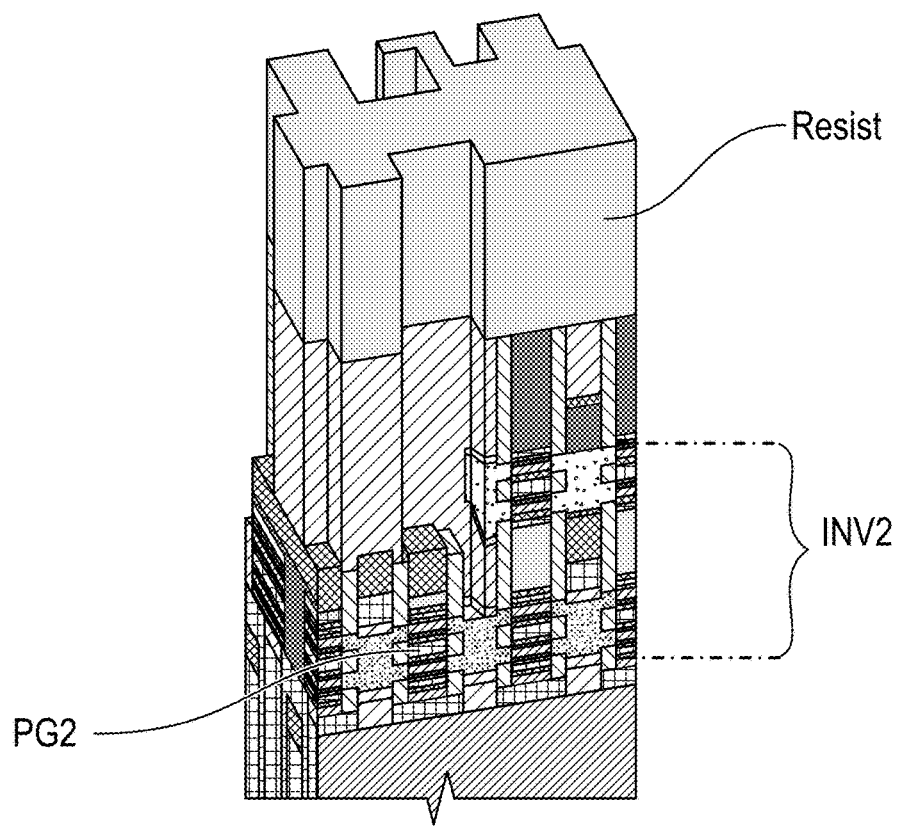
Figure 12D:
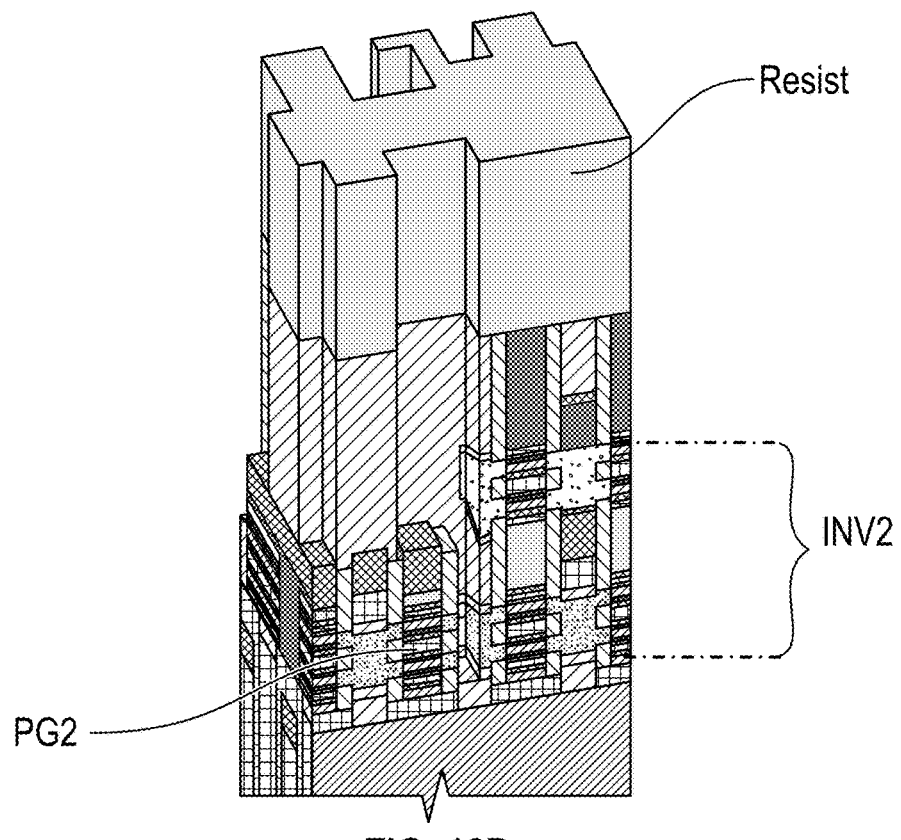
Figure 12E:
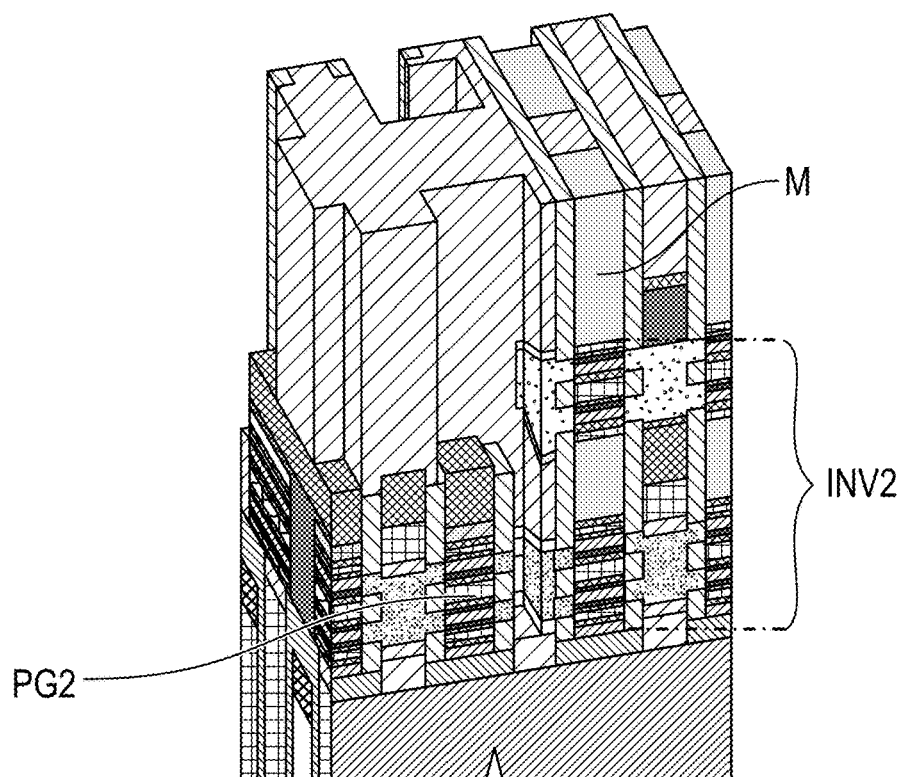

FIGS. 12A-12E illustrates formation of the cross-couple 2/3. FIG. 12A is like FIG. 11A but focuses on cross-section B to better illustrate the XC etch. First, a dielectric step etches the fourth fill material F4 or oxide (SiO2) selectively to the gate spacer (e.g., SiN, SiON, SiCN, SiOCN, etc.) in FIG. 12C. This exposes the side of the source or drain of the PMOS of the second inverter INV2 and the top of a portion of the shared source or drain of the second pass-gate PG2 and of the NMOS of the second inverter INV2. It should be noted that at this step, a short isotropic oxide etch (1-4 nm) could be performed to further expose these elements. Second, the Ti silicide and Si of the source or drain is removed all the way down by anisotropic etch, selective to oxide, exposing sides of the shared source or drain, as seen in FIGS. 12D-12E, the sides of the shared source or drain of the second pass-gate PG2 and of the NMOS of the second inverter INV2 are uncovered.

Figure 13A:
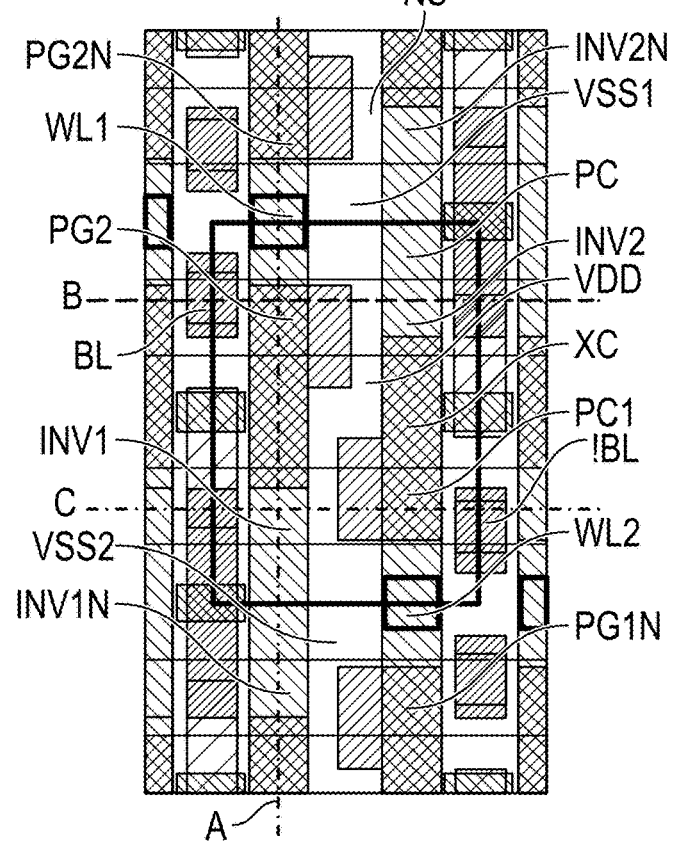
FIGS. 13A-13E show a formation of cross-couple, in accordance with exemplary embodiments of the disclosure.
Figure 13B:
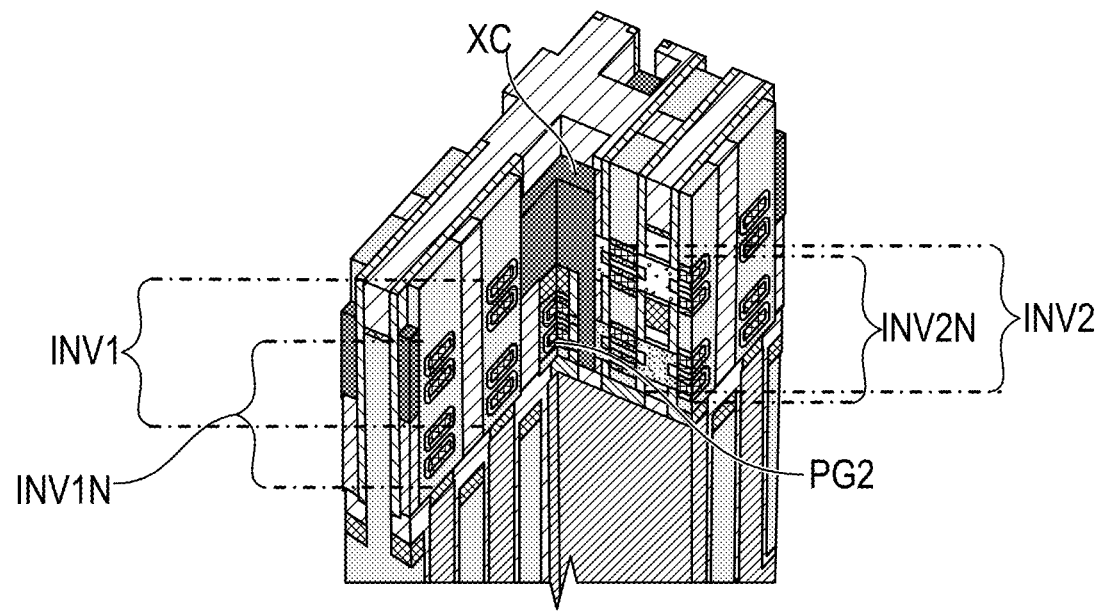
Figure 13C:
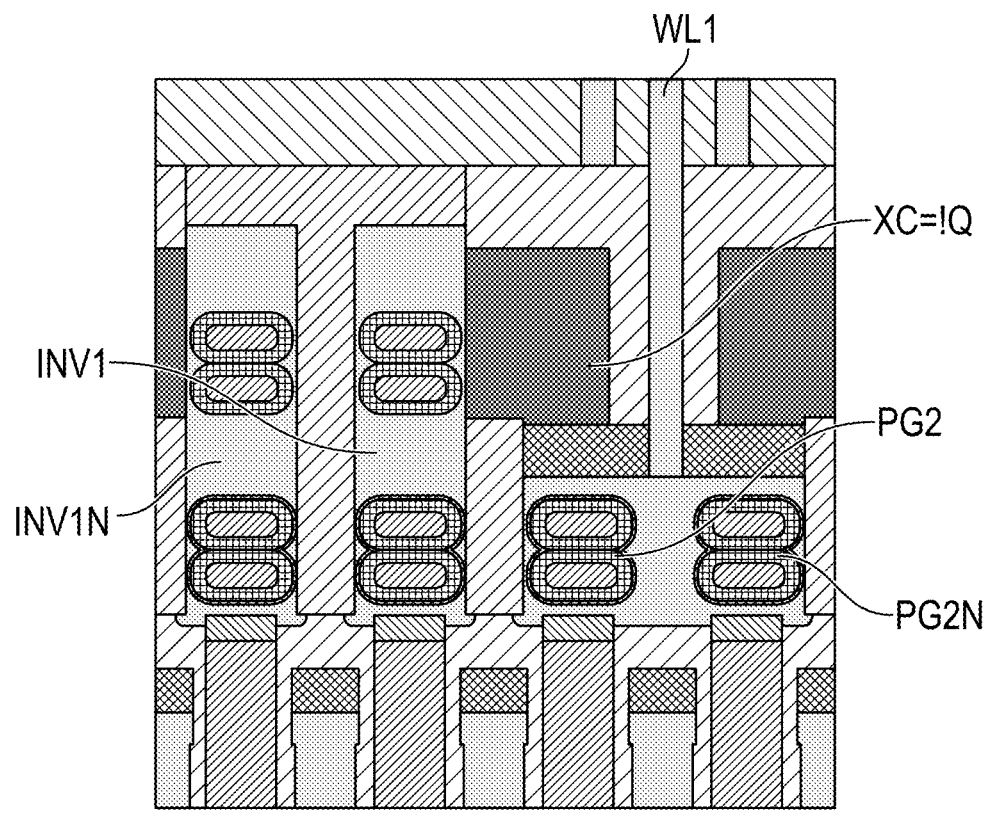
Figure 13D:
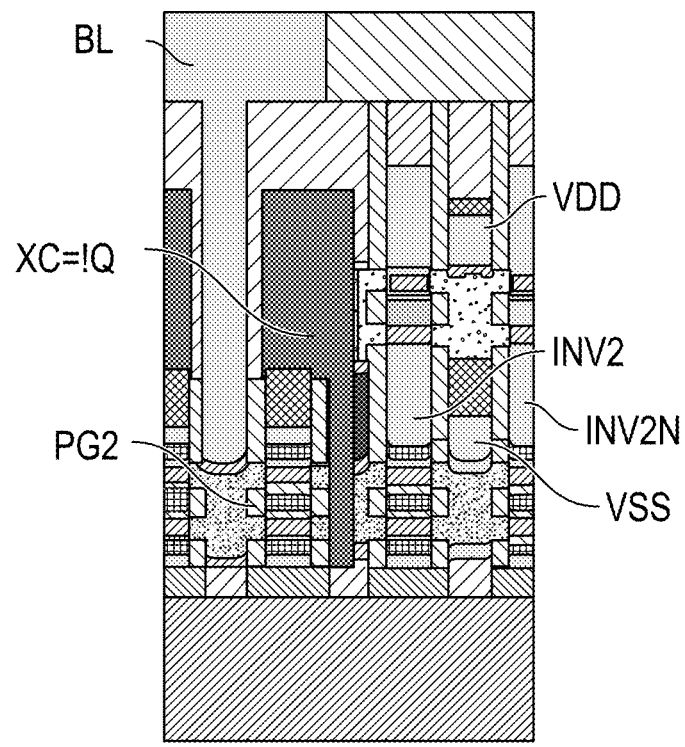
Figure 13E:
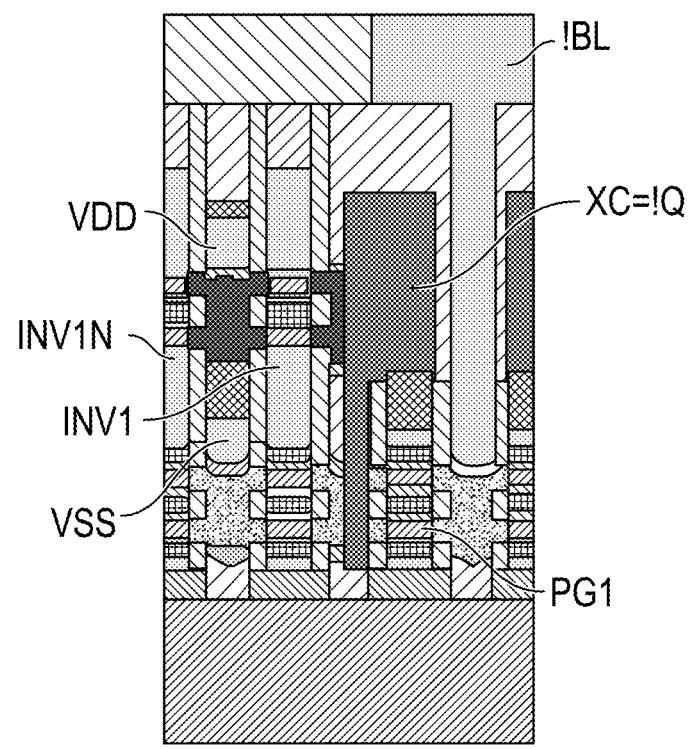
Figure 13F:
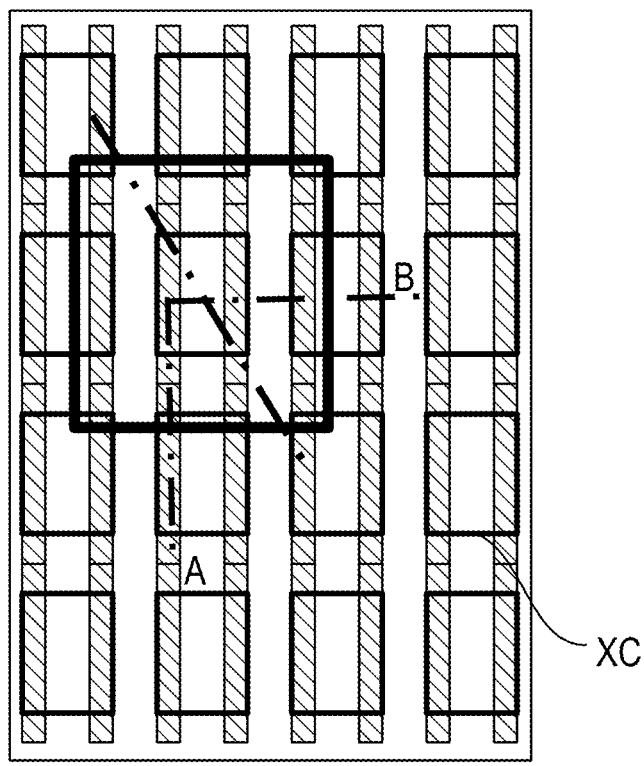
FIGS. 13F-13G show an exposure pattern of rectangles, in accordance with exemplary embodiments of the disclosure.
Figure 13G:
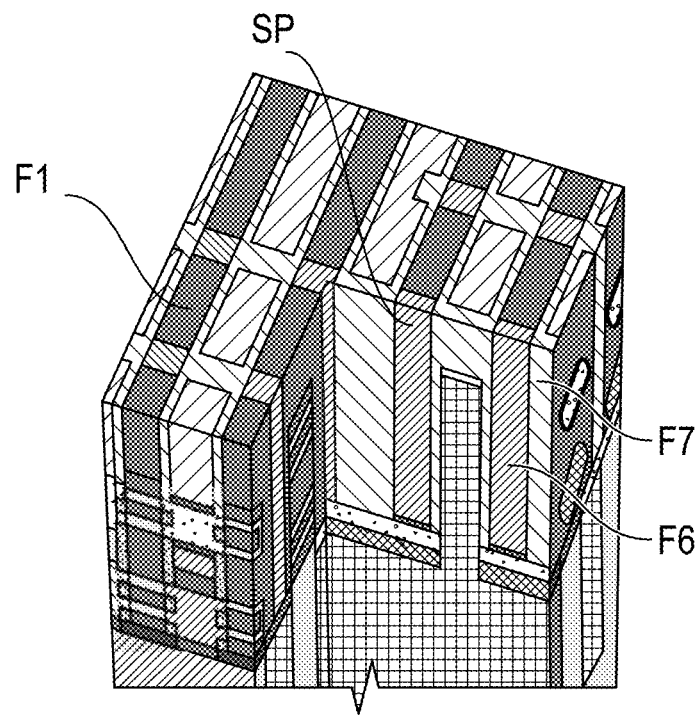

FIG. 13A shows formation of the cross-couple 3/3 including metallization of the cross-couple. Now that the XC etch is completed, the cavity created is filled by metal (W, Ru, Co, Cu) as shown in FIGS. 13B-E. As illustrated on the different cross-sections A-B in FIG. 13B, A in FIG. 13C, B in FIG. 13D, and C in FIG. 13E, when the metal is dropped into the cavity, it connects together the source or drain of the second pass-gate PG2, the source or drain of each device of the second inverter INV2 and the gate of first inverter INV1, therefore effectively forming the cross-couple XC. In addition, in FIG. 13B, as mentioned earlier, XC represents cross-couple layer, INV2N represents the neighbor device of the second inverter. WL1 and WL2 represents word lines, and INV1N represents the neighbor device of the first inverter. In FIG. 13E, cross-section C represents the cross-couple XC for the other symmetric half of the bit cell. In FIGS. 13D and 13E, BL and !BL represents bit lines, VSS1 and VSS2 represent two different VSSs In alternative embodiments, a rectangular pattern can be used for forming the cross-couple XC instead of L-shaped designs being printed. For example, FIG. 12A illustrates a pattern of L-shaped features to print on the substrate for cross-couple XC formation. Such shapes, however, can be difficult to print with photolithography at relatively small scales. FIG. 13F, however, illustrates an alternative exposure pattern of rectangles. By way of a non-limiting example, cross-couple XC rectangles of 60 nm by 80 nm can be printed. For this alternative embodiment, a pillar made by a seventh fill material F7 can be used as a self-aligned feature for an initial etch. The seventh fill material F7 may be SiOC. An exposed pattern can be developed and transferred into a hardmask (e.g., 20 nm of silicon nitride.) The etch mask and intermediate layers can be removed. The patterned hardmask can be used to etch a dielectric below the hardmask. These openings can be filled with particular material, such as the seventh fill material F7 or SiOC. An overburden of SiOC F7 can be recessed. Next, amorphous Si can be removed and replaced with SiN F6, with CMP planarizing and removing the hardmask. The pillar made by SiOC F7 is now in place, as shown in FIG. 13G. Resuming the flow after the second CT_T patterning and the removal of the top dummy PMOS devices as previously described, the alternative rectangular cross-couple XC shapes of FIG. 13F are patterned and when the cross-couple XC etch is performed, the pillar made by SiOC F7 remains in place. When followed by metallization M of the cross-couple XC, this results in the self-aligned formation of the two cross-couple XC shapes needed for the bit cell.

In FIG. 13G, dummy gate material F1 is a same material item as dummy gate material F1 in FIG. 5B. Similarly, in FIG. 13G, separation pillar SP is a same material item as separation pillar SP in FIG. 5B. FIG. 5B shows different hash patterns for dummy gate material F1 and separation pillar SP for clarity within that drawing.

Figure 14A:
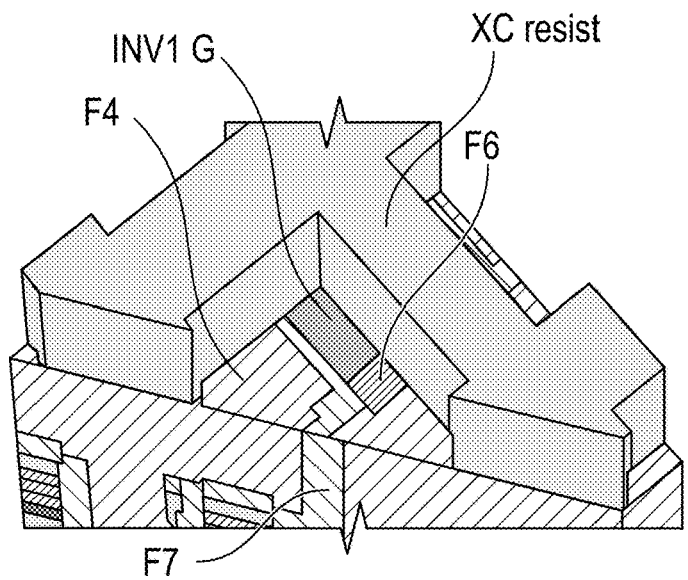
FIGS. 14A-14C show an etch mask for the cross-couple etch, in accordance with exemplary embodiments of the disclosure.
Figure 14B:
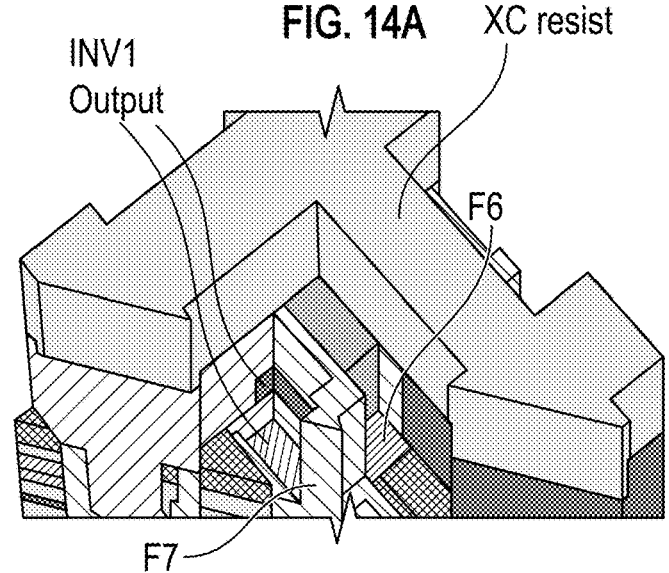
Figure 14C:
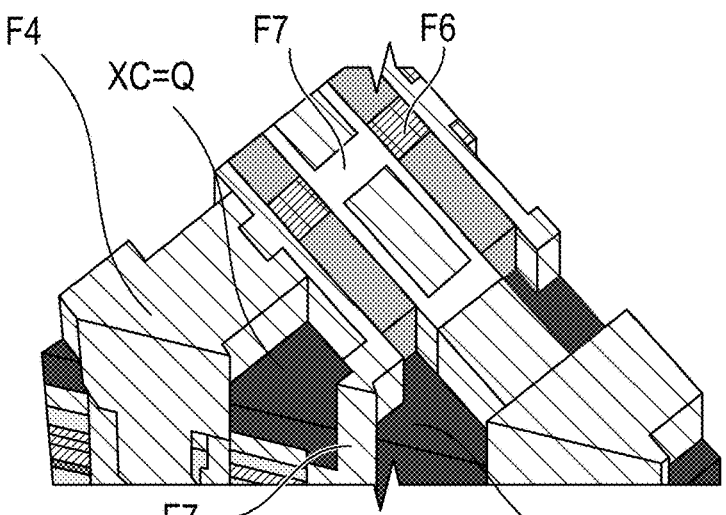

FIGS. 14A-14C illustrate an example result following the angled cross-section line of FIG. 13F. Cross-couple XC rectangles are patterned as shown on FIG. 14A, then the cross-couple XC etch is performed on FIG. 14B. As explained before, the cross-couple XC etch exposes all the surfaces of interest. Also, as can be seen on FIG. 14B, the pillar made by SiOC F7 remains, effectively splitting the cross-couple XC rectangle into the two cross-couple XC shapes needed for the bit cell in a self-aligned manner. Metallization M is then performed to complete the cross-couple XC formation. A possible result is that the source and drain of top PMOS can be completely removed by the cross-couple XC etch, so that the cross-couple XC only connects to source and drain extensions.

Figure 15A:
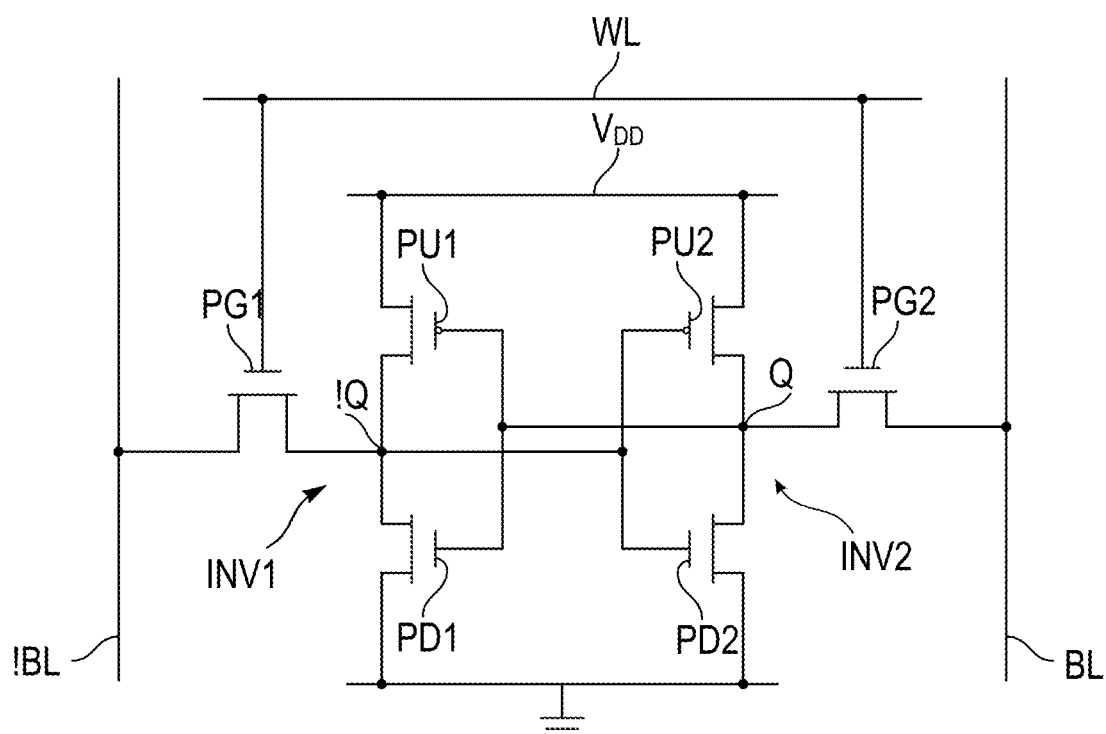
FIGS. 15A-15B show a final SRAM bit cell structure, in accordance with exemplary embodiments of the disclosure.

Finally, as another important item of embodiments herein, this CFET bit cell architecture allows for tuning of the electrical behavior of the SRAM bit cell. As mentioned with the introduction of FIG. 3A, there are many SRAM bit cell topologies to address different applications. Similar to logic, these applications range from high density to high performance. Thus, the bit cell topology ranges from the smallest cell achievable by the process to bigger cells. The smallest cell offers maximum density and therefore low cost, but also minimum drive current strength, e.g., lower speed. The bigger cells have lower density, higher cost, but are faster. On the schematics of FIG. 15A, this translates in different drive strength requirements for pull-up PU, pull-down PD, and pass-gate PG. The description of FIG. 15A is similar to the description associated with FIG. 2. FinFET accommodates this need by providing bit cell designs with a varying active fin number for each device. For example, one fin for the PMOS device, e.g., pull-up PU, but two fins for the NMOS devices, e.g., pull-down PD and pass-gate PG, which is abbreviated as a 1-2-2 cell topology, as opposed to 1-1-1, 2-2-2, 1-3-3, etc.

Figure 15B:
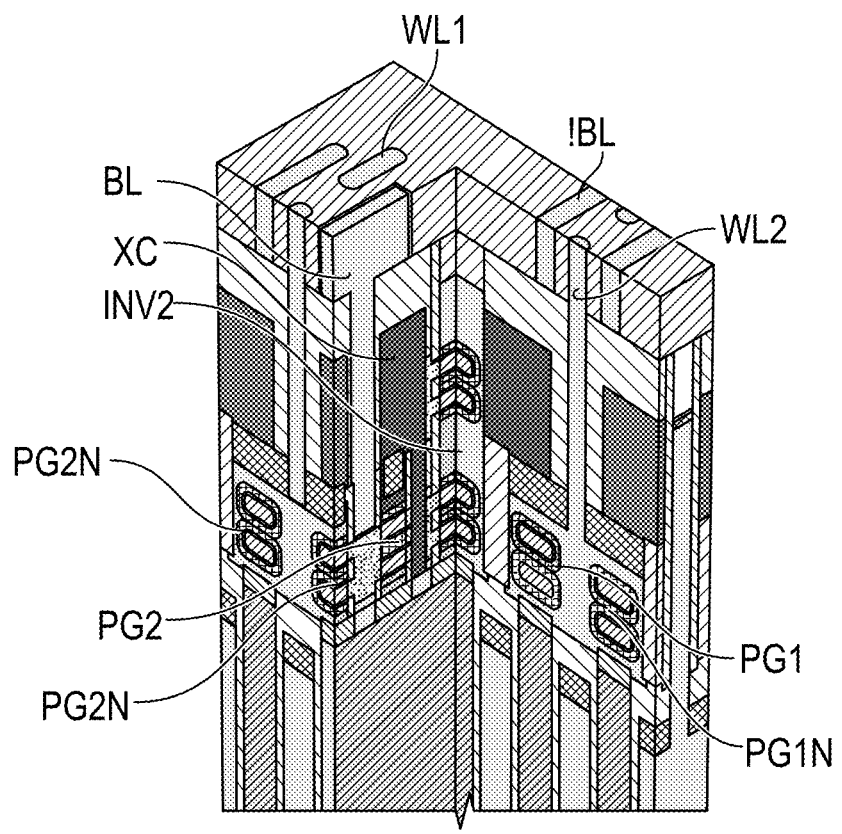

FIG. 15B illustrates a final structure. Techniques herein can accommodate similar flexibility by adjusting a number of active silicon channels or nano-sheets NS used by each device. For example, one nano-sheet NS for the top PMOS pull-up transistors PU1 and PU2, and two nano-sheets NS for the bottom NMOS pull-down transistors PD1 and PD2, and pass-gates PG1 and PG2. Note that there are different embodiments based on when the dummy PMOS devices above the NMOS pass-gates are removed. Alternative embodiments can use resist CT_T only one time. Also, gate dielectric separation between NMOS and PMOS can be omitted. CT_T can be used to etch away dummy devices and etch control to stop before removing the bottom.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A static random access memory (SRAM), comprising:
a plurality of SRAM bit cells provided on a substrate and positioned adjacent to each other in a horizontal direction along a working surface of the substrate, each SRAM bit cell comprising:
at least six transistors including at least two NMOS transistors and at least two PMOS transistors;
each of the at least six transistors being lateral gate-all-around transistors in that gates wraps all around a cross section of channels of the at least six transistors;
the at least six transistors positioned in two decks in which a second deck is positioned vertically above a first deck relative to a working surface of the substrate;
a first inverter formed using a first transistor positioned in the first deck and a second transistor positioned in the second deck;
a second inverter formed using a third transistor positioned in the first deck and a fourth transistor positioned in the second deck; and
a pass gate located in either the first deck or the second deck, wherein a first pass gate of a first bit cell is positioned adjacent to a second pass gate of a second bit cell of the plurality of bit cells along the horizontal direction, and the first and second pass gates share a common gate structure.

2. The static random access memory of claim 1, wherein each transistor includes multiple channels.

3. The static random access memory of claim 1, wherein a first portion of transistors are formed with more channels relative to a second portion of transistors.

4. The static random access memory of claim 1, wherein an output of the first inverter connects to an input of the second inverter.

5. The static random access memory of claim 1, wherein an output of the second inverter connects to an input of the first inverter.

6. The static random access memory of claim 1 further comprises:
a first ground voltage rail located at a top boundary of the SRAM bit cell,
a second ground voltage rail located at a bottom boundary of the SRAM bit cell, and
a standby supply voltage rail located in a middle of the SRAM bit cell.

7. The static random access memory of claim 1, wherein the pass gate is located in the first deck, and wherein a cross-couple is formed above the pass gate in the second deck.

8. The static random access memory of claim 1, wherein at least one NMOS transistor and at least one PMOS transistor share a common vertical gate.

9. A static random access memory (SRAM), comprising:
a plurality of SRAM bit cells provided on a substrate and positioned adjacent to each other in a horizontal direction along a working surface of the substrate, each SRAM bit cell comprising:
at least six transistors including at least two NMOS transistors and at least two PMOS transistors;
each of the at least six transistors being lateral transistors with channels formed from nano-sheets grown by epitaxy;
the at least six transistors positioned in two decks in which a second deck is positioned vertically above a first deck relative to a working surface of the substrate, wherein at least one NMOS transistor and at least one PMOS transistor share a common vertical gate;
a first inverter formed using a first transistor positioned in the first deck and a second transistor positioned in the second deck;
a second inverter formed using a third transistor positioned in the first deck and a fourth transistor positioned in the second deck; and
a pass gate located in either the first deck or the second deck, wherein a first pass gate of a first bit cell is positioned adjacent to a second pass gate of a second bit cell of the plurality of bit cells along the horizontal direction, and the first and second pass gates share a common gate structure.

10. The static random access memory of claim 9, wherein each lateral transistor includes multiple channels.

11. The static random access memory of claim 10, wherein each of the multiple channels is between 5 nm and 30 nm.

12. The static random access memory of claim 9 further comprises:
a first ground voltage rail located at a top boundary of the SRAM bit cell,
a second ground voltage rail located at a bottom boundary of the SRAM bit cell, and
a standby supply voltage rail located in a middle of the SRAM bit cell.

13. The static random access memory of claim 9, wherein an output of the first inverter connects to an input of the second inverter.

14. The static random access memory of claim 9, wherein an output of the second inverter connects to an input of the first inverter.

15. The static random access memory of claim 9, wherein the pass gate is located in the first deck, and wherein a cross-couple is formed above the pass gate in the second deck.

16. The static random access memory of claim 9, wherein a first portion of transistors are formed with more channels relative to a second portion of transistors.

17. A method for forming a static random access memory (SRAM) bit cell on a substrate and positioned adjacent to each other in a horizontal direction along a working surface of the substrate, the method comprising:
forming at least six transistors including at least two NMOS transistors and at least two PMOS transistors, each of the six transistors being lateral transistors with channels formed from nano-sheets grown by epitaxy, the at least six transistors positioned in two decks in which a second deck is positioned vertically above a first deck relative to a working surface of the substrate, wherein at least one NMOS transistor and at least one PMOS transistor share a common vertical gate;
forming a first inverter using a first transistor positioned in the first deck and a second transistor positioned in the second deck;
forming a second inverter formed using a third transistor positioned in the first deck and a fourth transistor positioned in the second deck;
forming a pass gate located in either the first deck or the second deck; and
forming a common gate structure for a first pass gate of a first bit cell is positioned adjacent to a second pass gate of a second bit cell of the plurality of bit cells along the horizontal direction.

18. The method of claim 17, wherein the pass gate is located in the first deck, and wherein a cross-couple is formed above the pass gate in the second deck.

19. The static random access memory of claim 1, wherein each bit cell of the SRAM further comprising a plurality of buried power rails each provided vertically below the first deck, the plurality of vertical power rails providing both VDD and VSS power to the SRAM.

20. The method of claim 17, further comprising forming a plurality of buried power rails providing both VDD and VSS power to each SRAM bit cell, each power rail provided vertically below the first deck.

* * * * *